US010629496B2

(12) United States Patent
More et al.

(10) Patent No.: US 10,629,496 B2
(45) Date of Patent: Apr. 21, 2020

(54) METHODS FOR FORMING TRANSISTOR GATES WITH HAFNIUM OXIDE LAYERS AND LANTHANUM OXIDE LAYERS

(71) Applicant: Taiwan Semiconductor Manufacturing Company, Ltd., Hsinchu (TW)

(72) Inventors: Shahaji B. More, Hsinchu (TW); Zheng-Yang Pan, Zhubei (TW); Chun-Chieh Wang, Kaohsiung (TW); Shih-Chieh Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 222 days.

(21) Appl. No.: 15/664,071

(22) Filed: Jul. 31, 2017

(65) Prior Publication Data
US 2019/0035694 A1 Jan. 31, 2019

(51) Int. Cl.
*H01L 27/092* (2006.01)
*H01L 21/8238* (2006.01)
(Continued)

(52) U.S. Cl.
CPC ........ *H01L 21/823857* (2013.01); *H01L 21/02148* (2013.01); *H01L 21/02164* (2013.01); *H01L 21/02181* (2013.01); *H01L 21/02192* (2013.01); *H01L 21/28088* (2013.01); *H01L 21/823821* (2013.01); *H01L 27/0922* (2013.01); *H01L 27/0924* (2013.01); *H01L 29/0847* (2013.01); *H01L 29/42364* (2013.01); *H01L 29/4966* (2013.01); *H01L 29/511* (2013.01); *H01L 29/513* (2013.01); *H01L 29/66545* (2013.01); *H01L 29/66636* (2013.01); *H01L 29/66795* (2013.01); *H01L 21/0228* (2013.01);
(Continued)

(58) Field of Classification Search
CPC .......... H01L 21/823857; H01L 29/513; H01L 29/66545; H01L 27/0922; H01L 29/66636; H01L 29/511; H01L 21/02148; H01L 21/28088; H01L 21/02192; H01L 21/02181; H01L 21/02164; H01L 29/42364; H01L 21/823821; H01L 27/0924; H01L 29/0847; H01L 29/4966; H01L 29/517; H01L 29/6656; H01L 21/28194; H01L 21/0228; H01L 21/02271; H01L 29/7848; H01L 21/823418
See application file for complete search history.

(56) References Cited

U.S. PATENT DOCUMENTS 6,413,386 B1 * 7/2002 Callegari ............ C23C 14/0057
136/257
2005/0236675 A1 * 10/2005 Nabatame ......... H01L 21/28194
257/369
(Continued)

*Primary Examiner* — William F Kraig
*Assistant Examiner* — Pavel G Ivanov
(74) *Attorney, Agent, or Firm* — Slater Matsil, LLP

(57) ABSTRACT

A method includes forming a gate stack of a transistor. The formation of the gate stack includes forming a silicon oxide layer on a semiconductor region, depositing a hafnium oxide layer over the silicon oxide layer, depositing a lanthanum oxide layer over the hafnium oxide layer, and depositing a work-function layer over the lanthanum oxide layer. Source/drain regions are formed on opposite sides of the gate stack.

20 Claims, 23 Drawing Sheets

(51) Int. Cl.
    *H01L 21/02*     (2006.01)
    *H01L 21/28*     (2006.01)
    *H01L 29/08*     (2006.01)
    *H01L 29/423*     (2006.01)
    *H01L 29/51*     (2006.01)
    *H01L 29/66*     (2006.01)
    *H01L 29/49*     (2006.01)
    H01L 21/8234     (2006.01)
    H01L 29/78     (2006.01)

(52) U.S. Cl.
    CPC .. *H01L 21/02271* (2013.01); *H01L 21/28194* (2013.01); *H01L 21/823418* (2013.01); *H01L 29/517* (2013.01); *H01L 29/6656* (2013.01); *H01L 29/7848* (2013.01)

(56) References Cited

U.S. PATENT DOCUMENTS

2012/0187504 A1*   7/2012   Igarashi ............ H01L 21/76895
                                                257/390
2016/0315164 A1*  10/2016  Son ..................... H01L 29/4958

\* cited by examiner

METHODS FOR FORMING TRANSISTOR GATES WITH HAFNIUM OXIDE LAYERS AND LANTHANUM OXIDE LAYERS

BACKGROUND

Metal-Oxide-Semiconductor (MOS) devices are basic building elements in integrated circuits. An existing MOS device typically has a gate electrode formed of polysilicon doped with p-type or n-type impurities, using doping operations such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
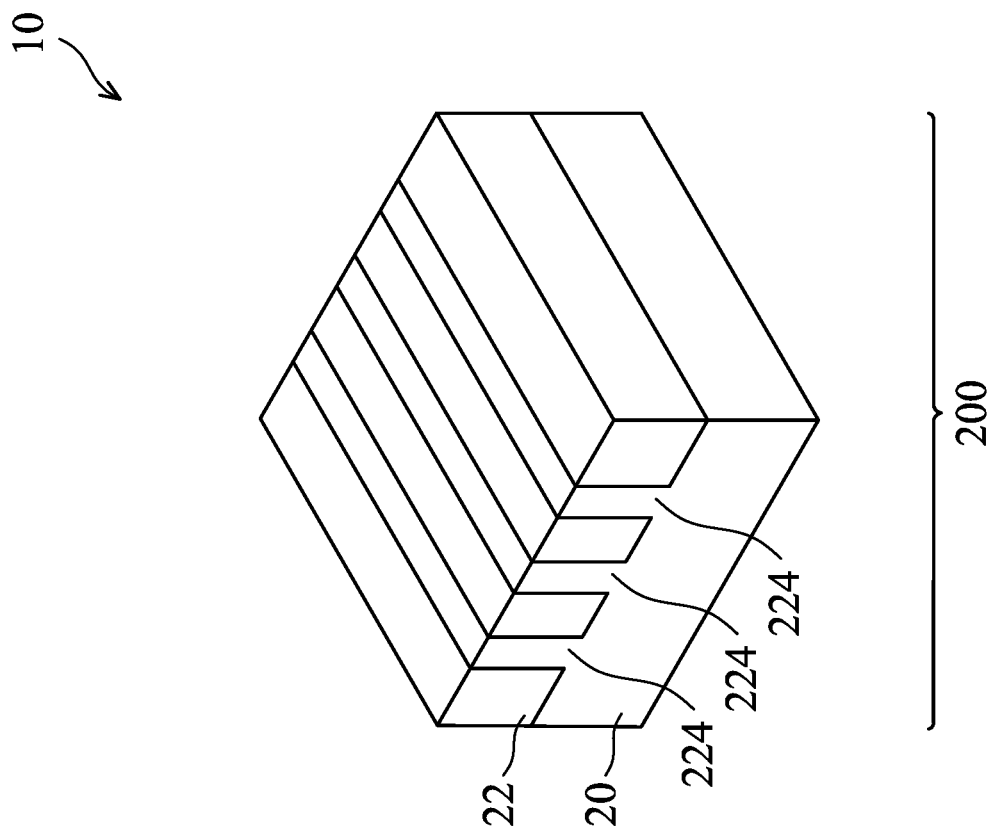
FIGS. 1 through 21 illustrate the cross-sectional views and perspective views of intermediate stages in the formation of Fin Field-Effect Transistors (FinFETs) in accordance with some embodiments.
Figure 1:
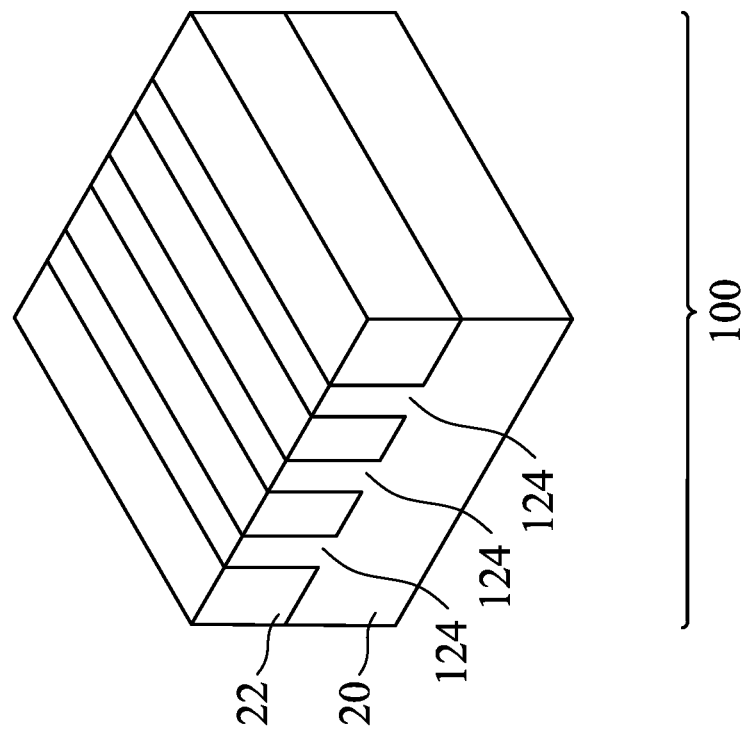

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concepts of the present disclosure. Planar transistors may also adopt the concept of the present disclosure.

Figure 23:
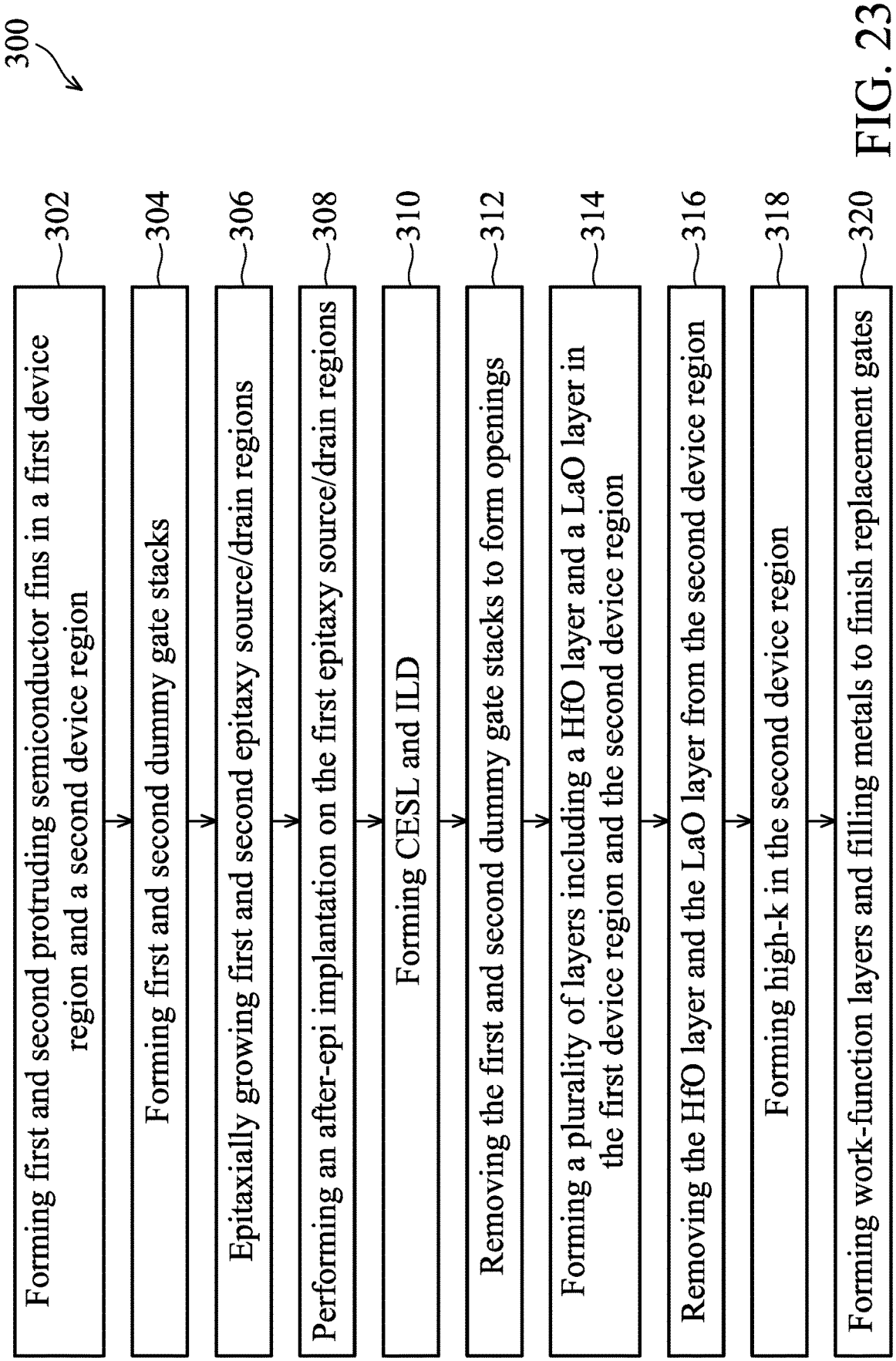
FIG. 23 illustrates a process flow for forming FinFETs in accordance with some embodiments.

FIGS. 1 through 21 illustrate the cross-sectional views and perspective views of intermediate stages in the formation of transistors (which may be FinFETs, for example) in accordance with some embodiments of the present disclosure. The steps shown in FIGS. 1 through 21 are also reflected schematically in the process flow 300 shown in FIG. 23. The formed transistors include a first transistor in device region 100 and a second transistor in device region 200. The transistor formed in device region 100 may be an n-type transistor such as an n-type planar transistor or an n-type FinFET as an example. In accordance with some embodiments, the transistor formed in device region 200 is a p-type transistor such as a p-type planar transistor or a p-type FinFET as an example. In accordance with alternative embodiments, the transistor formed in device region 200 is an n-type transistor that has a different specification than the transistor formed in device region 100. For example, the transistor formed in device region 200 may have a threshold voltage higher than the threshold voltage formed in device region 100.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. In accordance with some embodiments, substrate 20 includes a bulk silicon substrate and an epitaxy silicon germanium (SiGe) layer or a germanium layer (without silicon therein) over the bulk silicon substrate. Substrate 20 may be doped with a p-type or an n-type impurity. Isolation regions 22 such as Shallow Trench Isolation (STI) regions may be formed to extend into substrate 20. The portions of substrate 20 between neighboring STI regions 22 are referred to as semiconductor strips 124 and 224, which are in device regions 100 and 200, respectively.

STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on coating, or the like.

Figure 2:
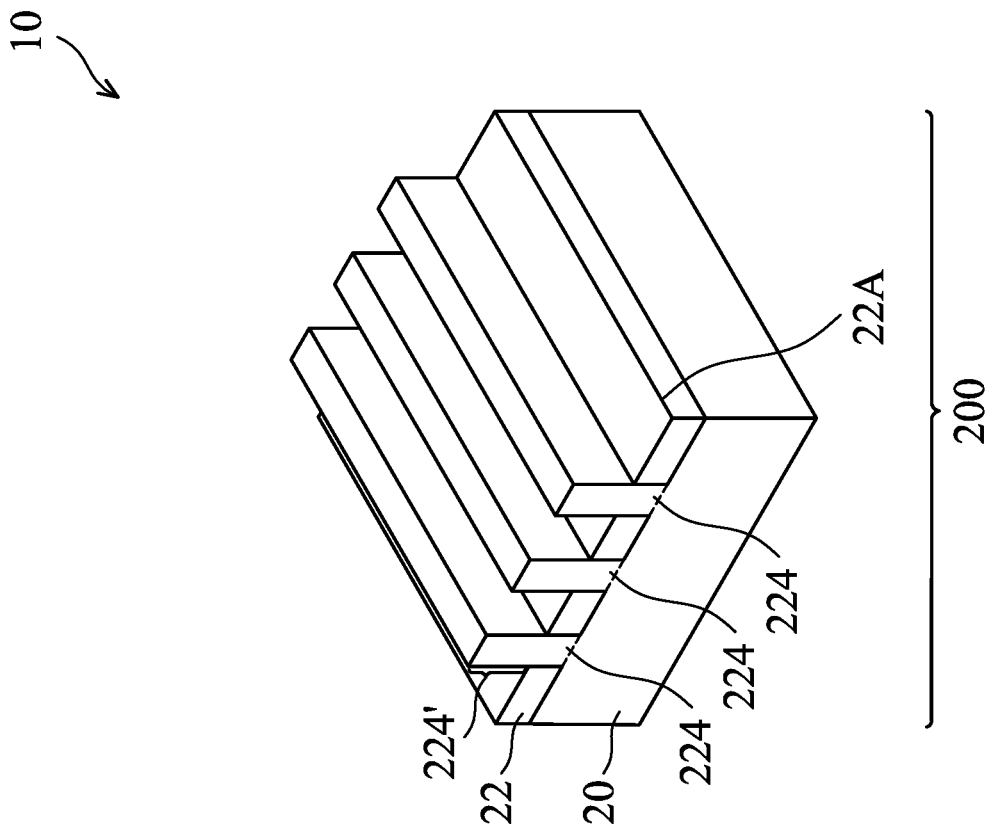
Figure 2:
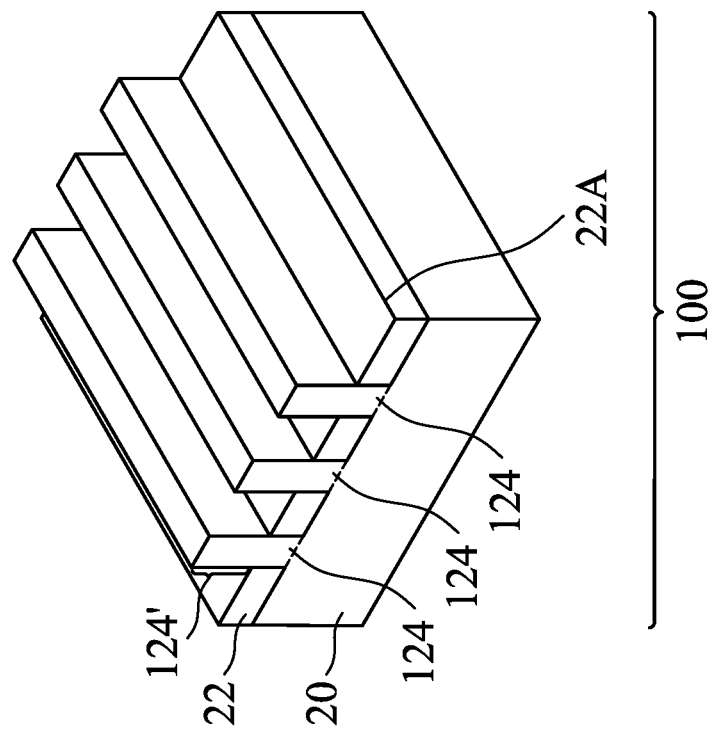

Referring to FIG. 2, STI regions 22 are recessed, so that the top portions of semiconductor strips 124 and 224 protrude higher than the top surfaces 22A of the neighboring STI regions 22 to form protruding fins 124' and 224'. The respective step is illustrated as step 302 in the process shown in FIG. 23. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of STI regions 22 is performed using a wet etch process. The etching chemical may include diluted HF, for example.

Figure 3:
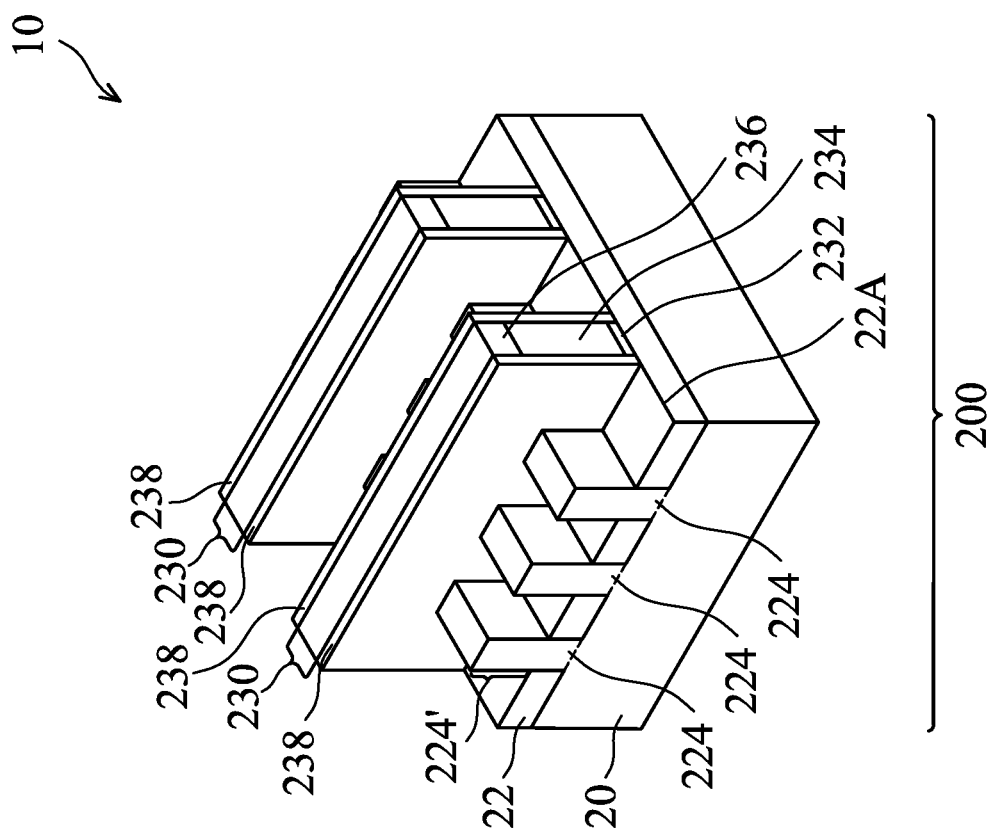
Figure 3:
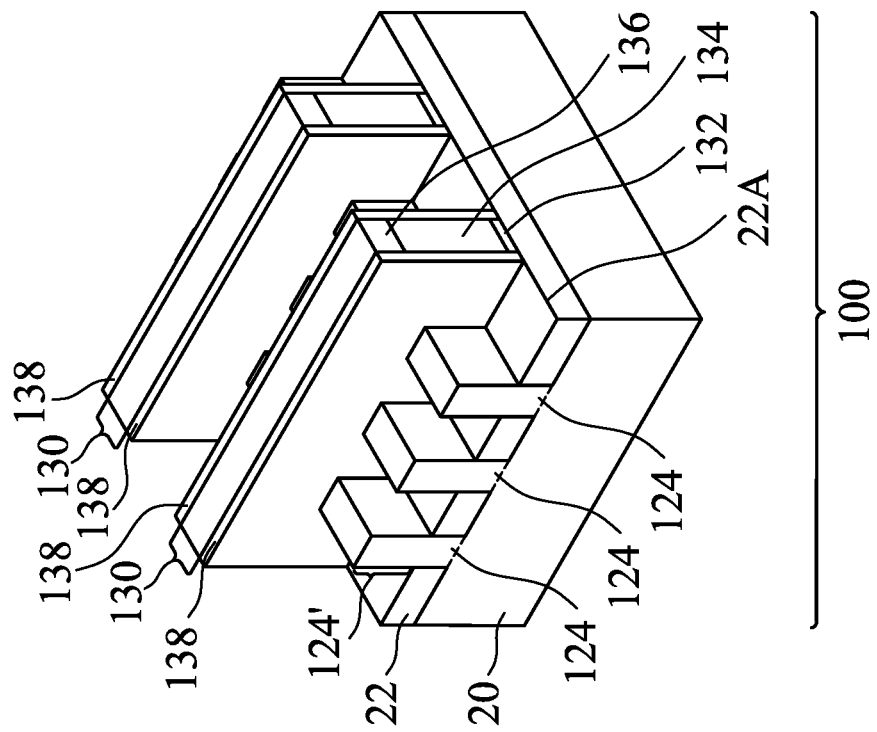

Referring to FIG. 3, dummy gate stacks 130 and 230 are formed on the top surfaces and the sidewalls of protruding fins 124' and 224', respectively. The respective step is illustrated as step 304 in the process shown in FIG. 23. Dummy gate stacks 130 may include gate dielectrics 132 and dummy gate electrodes 134 over dummy gate dielectrics 132. Dummy gate stacks 230 may include gate dielectrics 232 and dummy gate electrodes 234 over dummy gate dielectrics 232. Dummy gate electrodes 134 and 234 may be formed, for example, using polysilicon, and other materials may also be used. Each of dummy gate stacks 130 and 230 may also include one (or a plurality of) hard mask layers 136 and 236. Hard mask layers 136 and 236 may be formed of silicon nitride, silicon carbo-nitride, or the like. Each of dummy gate stacks 130 and 230 crosses over a single one or a plurality of protruding fins 124' and 224', respectively. Dummy gate stacks 130 and 230 may also have lengthwise directions perpendicular to the lengthwise directions of the respective protruding fins 124' and 224', respectively.

Next, gate spacers 138 and 238 are formed on the sidewalls of dummy gate stacks 130 and 230, respectively. In the meantime, fin spacers (not shown) may also be formed on the sidewalls of protruding fins 124' and 224'. In accordance with some embodiments of the present disclosure, gate spacers 138 and 238 are formed of a dielectric material(s) such as silicon carbon-oxynitride (SiCN), silicon nitride, or the like, and may have a single-layer structure or a multi-layer structure including a plurality of dielectric layers.

In accordance with some embodiments, each of gate spacers 138 includes a first dielectric layer 138A and a second dielectric layer 138B (refer to FIG. 7), with each of layers 138A and 138B formed through a blanket deposition step followed by an anisotropic etching step. In accordance with some embodiments, dielectric layer 138A is a low-k dielectric layer, and dielectric layer 138B is a non-low-k dielectric layer. Dielectric layer 138A may be formed of a low-k dielectric material having a dielectric constant (k value) lower than about 3.0, which may be formed of SiON or SiOCN, with pores formed therein in order to reduce its k value to a desired low-k value. Dielectric layer 138B may be formed of silicon nitride, for example. Gate spacers 238 have the same structure as gate spacers 138, and may include layers 238A and 238B formed of the same materials as layers 138A and 138B, respectively. In accordance with other embodiments, dielectric layer 138A is a non-low-k dielectric layer, and dielectric layer 138B is a low-k dielectric layer, and the corresponding low-k dielectric material and non-low-k dielectric material may be similar to what are described above.

Figure 4:
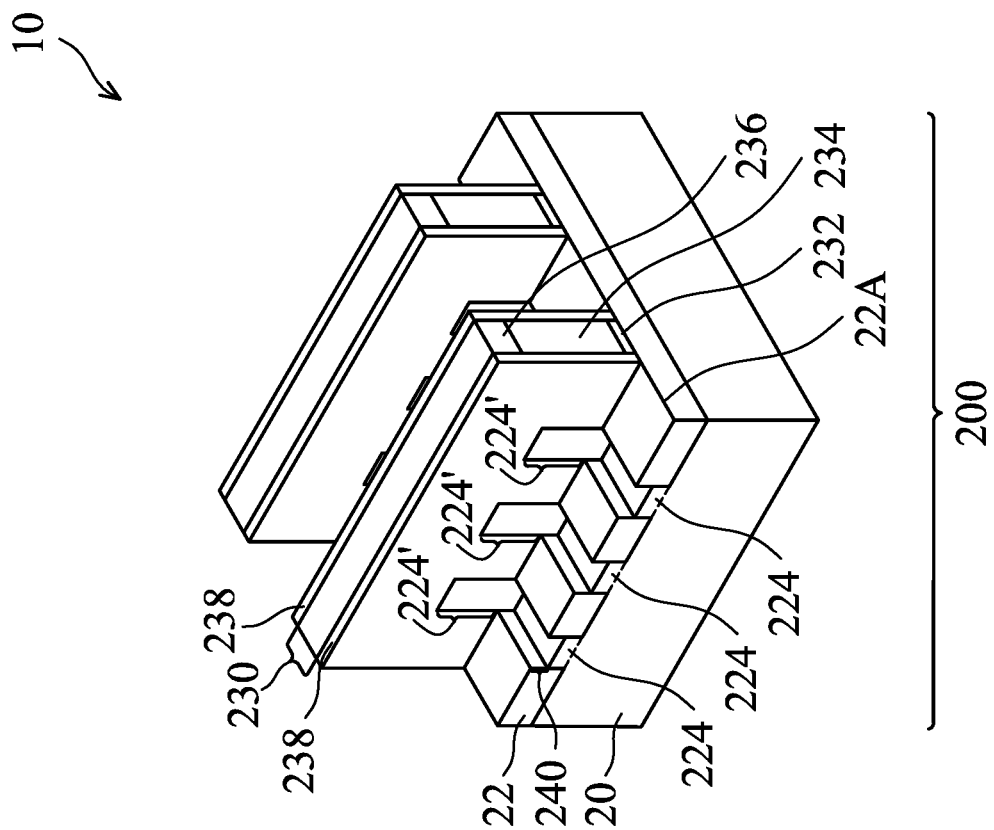
Figure 4:
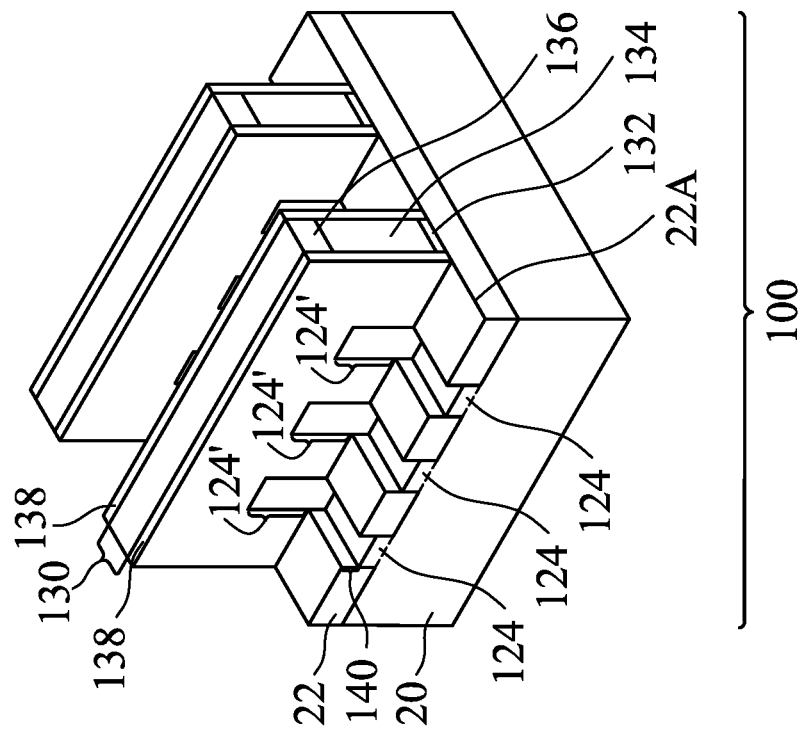

An etching step (referred to as source/drain recessing hereinafter) is then performed to etch the portions of protruding fins 124' and 224' that are not covered by dummy gate stacks 130 and 230 and gate spacers 138 and 238, resulting in the structure shown in FIG. 4. The recessing may be anisotropic, and hence the portions of fins 124' and 224' directly underlying the respective dummy gate stack 130/230 and gate spacers 138/238 are protected, and are not etched. The top surfaces of the recessed semiconductor strips 124 and 224 may be lower than the top surfaces of the adjacent STI regions 22 in accordance with some embodiments. Recesses 140 and 240 are accordingly formed between STI regions 22. The recessing in device regions 100 and 200 may be performed in a common etching process or in separate processes, and the depths of recesses 140 may be equal to or different from the depths of recesses 240.

Figure 5:
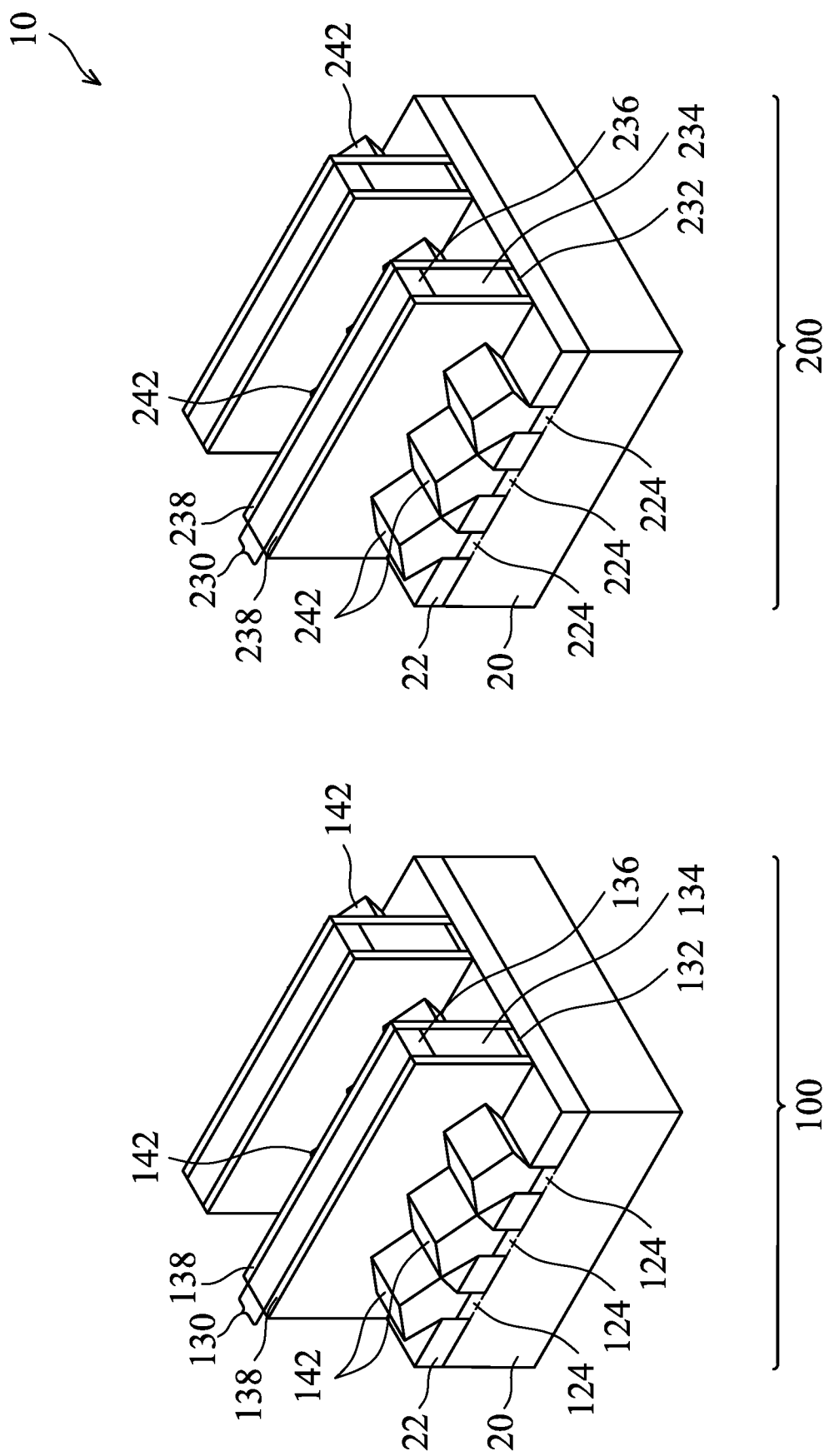

Next, epitaxy regions (source/drain regions) are formed by selectively growing a semiconductor material in recesses 140 and 240 simultaneously (or separately), resulting in the structure in FIG. 5. The respective step is illustrated as step 306 in the process shown in FIG. 23. In accordance with some exemplary embodiments, epitaxy regions 142 are formed of silicon phosphorous (SiP) or silicon carbon phosphorous (SiCP), which are of n-type. Epitaxy regions 242 may be formed of silicon germanium doped with boron (SiGeB) when the respective transistor in device region 200 is a p-type transistor. The formation of epitaxy regions 142 and 242 are performed separately using different masks (not shown). In accordance with alternative embodiments in which the transistor in device region 200 is also of n-type, epitaxy regions 242 may be formed of a same material, and formed simultaneously, as epitaxy regions 142. In accordance with alternative embodiments of the present disclosure, epitaxy regions 142 and 242 are formed of III-V compound semiconductors such as GaAs, InP, GaN, InGaAs, InAlAs, GaSb, AlSb, AlAs, AlP, GaP, combinations thereof, or multi-layers thereof. After recesses 140 and 240 are filled with the epitaxy semiconductor material, the further epitaxial growth of epitaxy regions 142 and 242 causes epitaxy regions 142 and 242 to expand horizontally, and facets may be formed. Epitaxy regions 142 and 242 form the source/drain regions of the respective transistors.

Figure 6:
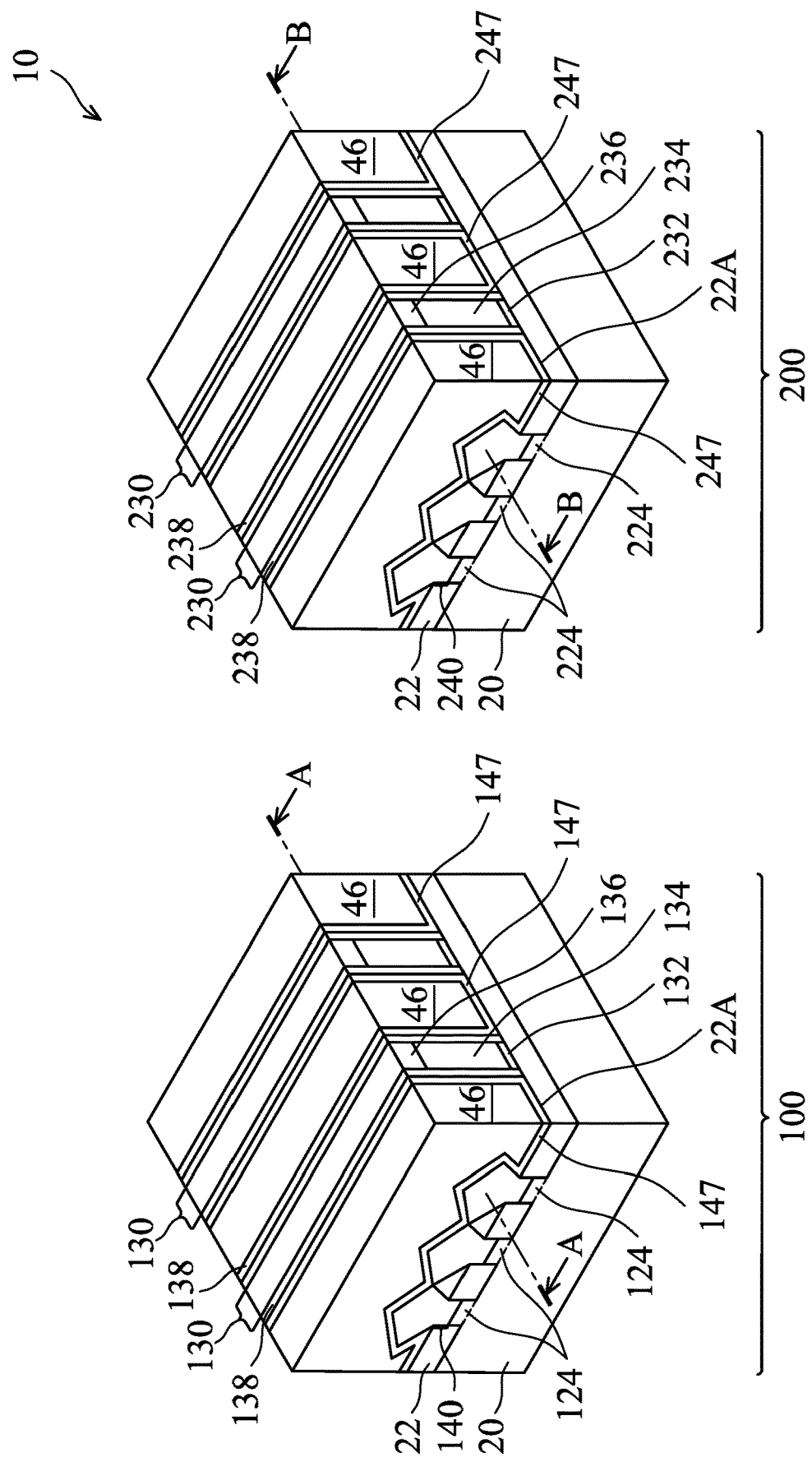

FIG. 6 illustrates a perspective view for forming Contact Etch Stop Layers (CESLs) 147 and 247 and Inter-Layer Dielectric (ILD) 46. The respective step is illustrated as step 310 in the process shown in FIG. 23. In accordance with some embodiments of the present disclosure, CESLs 147 and 247 are formed of silicon nitride, silicon carbo-nitride, or the like. CESLs 147 and 247 may be formed using a conformal deposition method such as ALD or CVD, for example. ILD 46 is formed over CESLs 147 and 247, and may be formed using, for example, FCVD, spin-on coating, CVD, or the like. ILD 46 may be formed of Phospho-Silicate Glass (PSG), Boro-Silicate Glass (BSG), Boron-Doped Phospho-Silicate Glass (BPSG), Tetra Ethyl Ortho Silicate (TEOS) oxide, or the like. A Chemical Mechanical Polish (CMP) may be performed to level the top surfaces of ILD 46, dummy gate stacks 130 and 230, and gate spacers 138 and 238 with each other.

Figure 7:
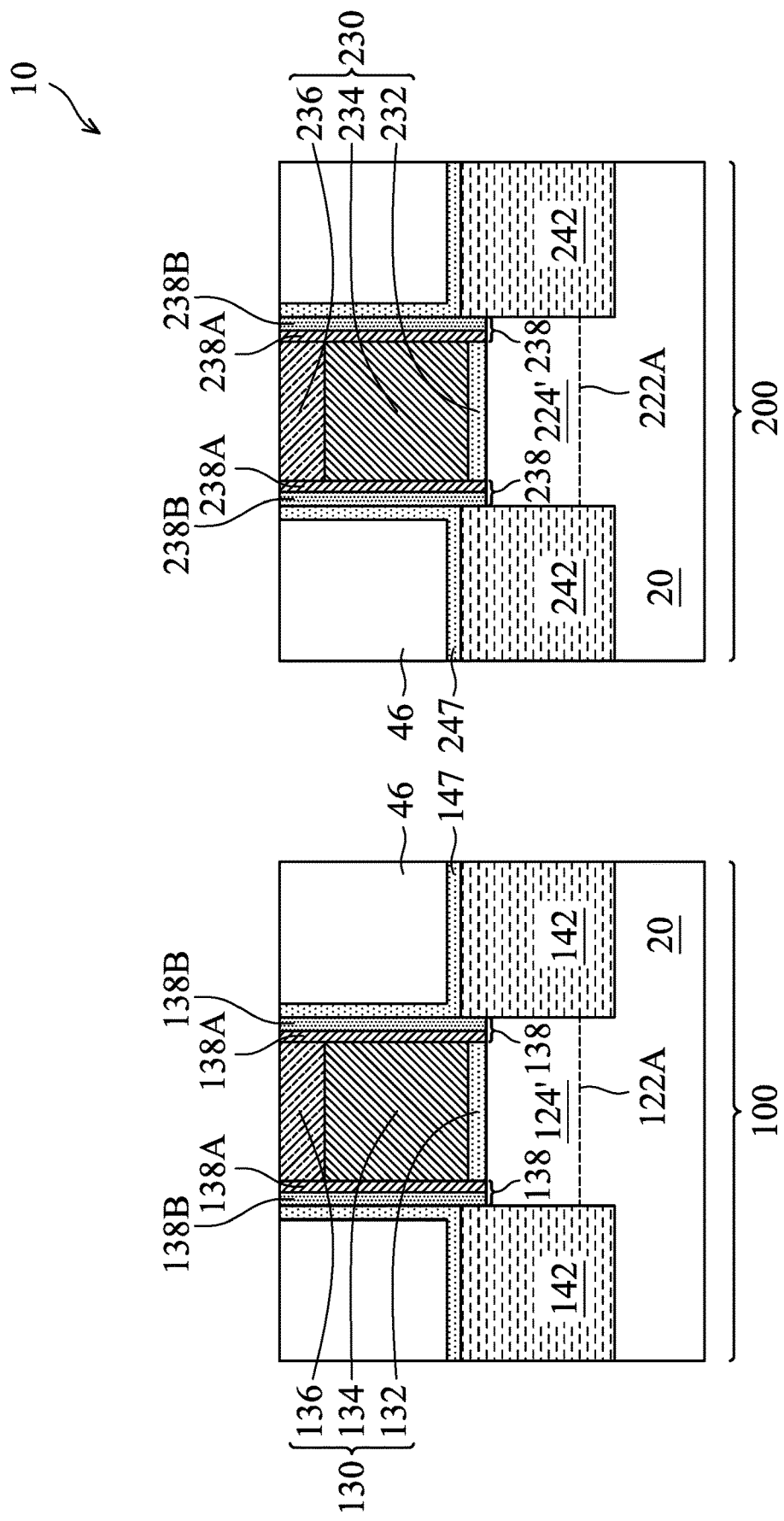

FIG. 7 illustrates the cross-sectional views of the structure shown in FIG. 6, with the cross-sectional views being obtained from the vertical plane containing line A-A and the vertical plane containing line B-B in FIG. 6. After the structure shown in FIGS. 6 and 7 is formed, the dummy gate stacks 130 and 230 including hard mask layers 136 and 236, dummy gate electrodes 134 and 234, and dummy gate dielectrics 132 and 232 are replaced with metal gates and replacement gate dielectrics. In FIGS. 6, 7, and 8 through 21, the top surfaces 122A and 222A of STI regions 22 are illustrated, and protruding fins 124' and 224' protrude higher than top surfaces 122A and 222A, respectively.

Figure 8:
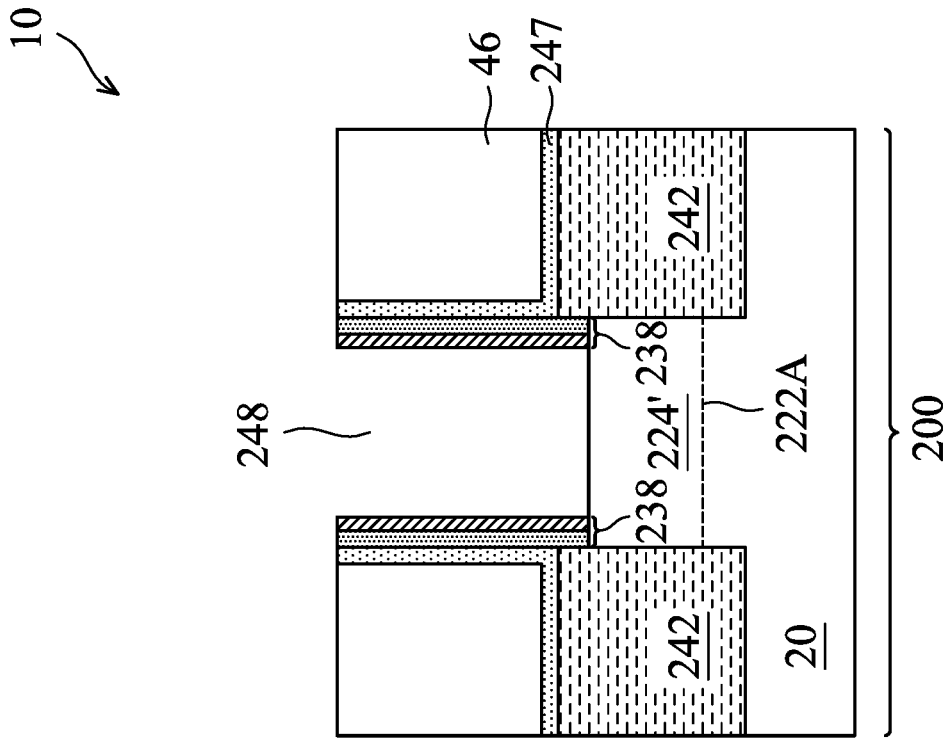
Figure 8:
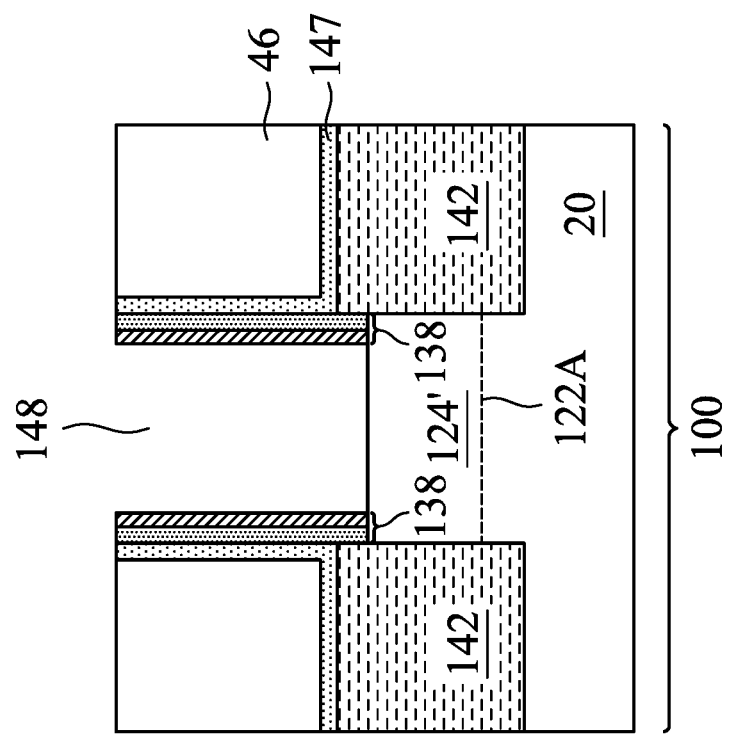

To form the replacement gates, hard mask layers 136 and 236, dummy gate electrodes 134 and 234, and dummy gate dielectrics 132 and 232 as shown in FIGS. 6 and 7 are removed through etching, forming openings 148 and 248 as shown in FIG. 8. The respective step is illustrated as step 312 in the process shown in FIG. 23. The top surfaces and the sidewalls of protruding fins 124' and 224' are exposed to openings 148 and 248, respectively.

Figure 9:
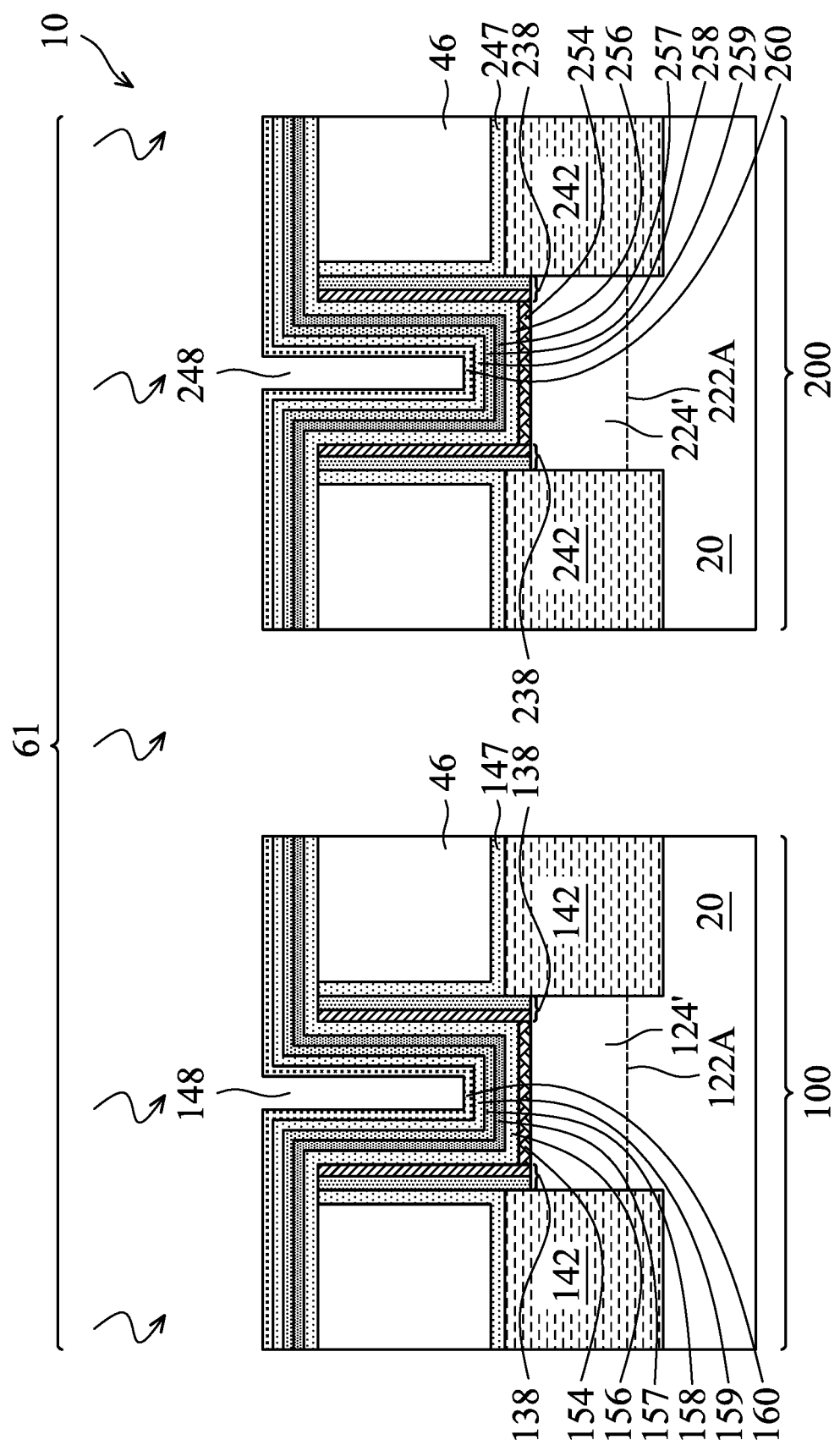

Next, referring to FIG. 9, a plurality of layers is formed in both device regions 100 and 200, with each of the plurality of layers extend into both openings 148 and 248, with corresponding layers (such as 154 and 254) in device regions 100 and 200 formed in the same process. The respective step is illustrated as step 314 in the process shown in FIG. 23. In accordance with some embodiments of the present disclosure, Interfacial Layers (ILs) 154 and 254 are formed on the exposed surfaces of protruding fins 124' and 224', respectively. Each of ILs 154 and 254 may include an oxide layer such as a silicon oxide layer, which is formed through the thermal oxidation of the surface layers of protruding fins 124' and 224', a chemical oxidation process, or a deposition process.

A plurality of layers 156, 256, 157, 257, 158, 258, 159, 259, 160, and 260 are formed using conformal deposition methods such as Atomic Layer Deposition (ALD) or Chemical Vapor Deposition (CVD), and hence the horizontal portions and vertical portions of each of these layers have substantially the same thickness, for example, with differences smaller than 10 percent. In accordance with some embodiments of the present disclosure, hafnium silicate (hafnium silicon oxide—HfSiO) layers 156 and 256 are deposited on, and are in contact with, ILs 154 and 254. The HfSiO layers 156 and 256 may include the compound (mixture) of hafnium oxide and silicon oxide. In addition, the atomic percentage of hafnium is significantly lower than the atomic percentage of silicon. In accordance with some embodiments, hafnium atomic percentage in hafnium silicate layers 156 and 256 is lower than about 5 percent, and may be between about 1 percent and 5 percent. Accordingly, hafnium silicate layers 156 and 256 include mainly silicon oxide and a small amount of hafnium oxide, and hence are considered as ILs. hafnium silicate layers 156 and 256 may be low-k dielectric layers due to the low Hf atomic percentage. Lowering the hafnium atomic percentage in hafnium silicate layer 156 results in improved interface (IL/HK) quality. The thicknesses of hafnium silicate layers 156 and 256 are small, and may be in the range between about 0.5 nm and about 3.0 nm. In accordance with alternative embodiments of the present disclosure, hafnium silicate layers 156 and 256 are not formed, and hence the overlying hafnium oxide layers 157 and 257 are in contact with ILs 154 and 254, respectively.

Hafnium silicate layers 156 and 256 may include the combination of $HfO_2$ and $SiO_2$, and the percentage of $HfO_2$ in hafnium silicate layers affects the percentage of the respective hafnium percentages. Hafnium silicate layers 156 and 256 may include $HfSiO_4$, and additional Si-containing molecules. The formation methods may include Chemical Vapor Deposition (CVD) or Atomic Layer Deposition (ALD). In accordance with some embodiments of the present disclosure, the formation of hafnium silicate layers 156 and 256 is performed by alternatingly depositing $HfO_2$ layers and $SiO_2$ layers using ALD. The $HfO_2$ layers and $SiO_2$ layers are very thin, for example, as thin as one atomic layer or several atomic layers. Also, the Hf atomic percentage may be adjusted by adjusting the ratio of the thickness of $HfO_2$ layer to the thickness of $SiO_2$ layer. The precursor for forming $HfO_2$ layers may include $HfCl_4$, $H_2O$ (or $O_3$), with a carrier gas such as Ar included. The precursor for forming $SiO_2$ may include a silicon-containing precursor and $H_2O$ (or $O_3$) as an oxidant. The silicon-containing precursor may include silane, $SiH[N(CH_3)_2]_4$ or $SiH[N(C_2H_5)_2]_3$. In accordance with yet alternative embodiments, the precursors may include liquid $Hf[N(CH_3)(C_2H_5)]_4$, $SiH[N(CH_3)_2]$, and $O_3$. When ALD is used, the purge gas may be selected from the group consisting of nitrogen, helium, argon, and combinations thereof. In addition, the oxidant gas may be selected from the group consisting of nitric oxide, oxygen, ozone, nitrous oxide, water steam, and combinations thereof.

Hafnium oxide ($HfO_2$) layers 157 and 257 are deposited over, and may be in contact with, hafnium silicate layers 156 and 256, respectively. Hafnium oxide layers 157 and 257 may also be in contact with ILs 154 and 254, respectively when hafnium silicate layers 156 and 256 are not formed. Hafnium oxide layers 157 and 257 are substantially free from silicon therein.

Next, lanthanum oxide (LaO) layers 158 and 258, which may be $La_2O_3$ in accordance with some embodiments, are formed over hafnium oxide layers 157 and 257, respectively. In accordance with some embodiments, lanthanum oxide layers 158 and 258 are in contact with hafnium oxide layers 157 and 257, respectively. The thickness of lanthanum oxide layers 158 and 258 may be in the range between about 0.5 nm and about 3.0 nm. Lanthanum oxide layers 158 and 258 may be substantially free from silicon therein.

In accordance with some embodiments of the present disclosure, lanthanum silicon oxide (LaSiO) layers 159 and 259 are deposited on, and are in contact with, Lanthanum oxide layers 158 and 258, respectively. LaSiO layers 159 and 259 may include the compound (mixture) of lanthanum oxide and silicon oxide. In accordance with some embodiments of the present disclosure, the atomic percentage of silicon in LaSiO layers 159 and 259 is lower than about 10 percent, and may be in the range between about 2 percent and about 6 percent. The thickness of LaSiO layers 159 and 259 is small, and may be in the range between about 0.5 nm and about 3.0 nm. In accordance with alternative embodiments of the present disclosure, LaSiO layers 159 and 259 are not formed, and hence the overlying hard mask layers 160 and 260 are in contact with lanthanum oxide layers 158 and 258, respectively.

Hard mask layers 160 and 260 are then formed in device regions 100 and 200. In accordance with some embodiments, hard mask layers 160 are and 260 are formed of titanium nitride, boron nitride, or the like. After the formation of hard mask layers 160 and 260, an anneal may be performed, as represented by arrows 61. The anneal may be a flash anneal or a furnace anneal, which may be performed at a temperature between about 550° C. and about 700° C.

Figure 10:
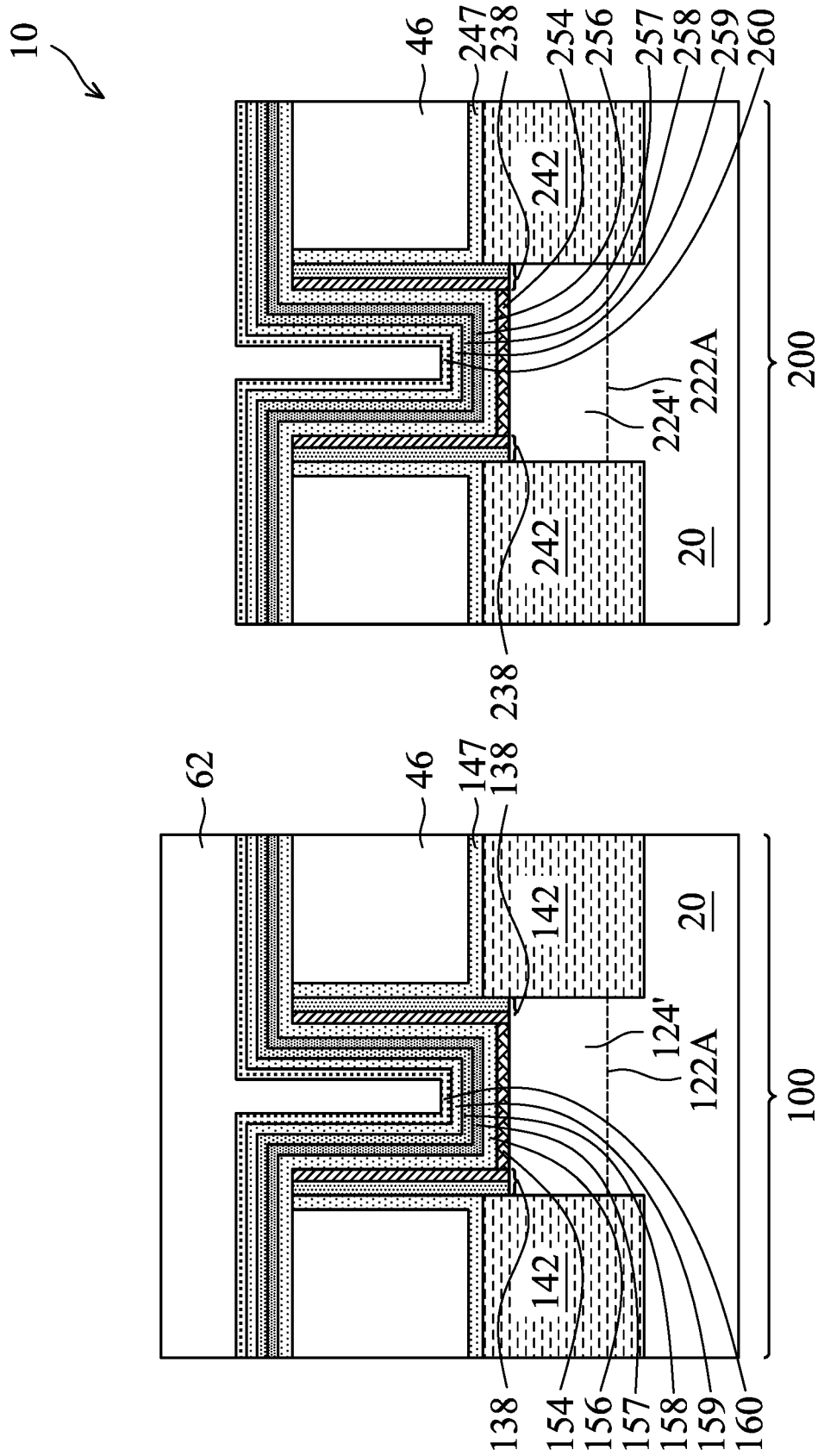
Figure 11:
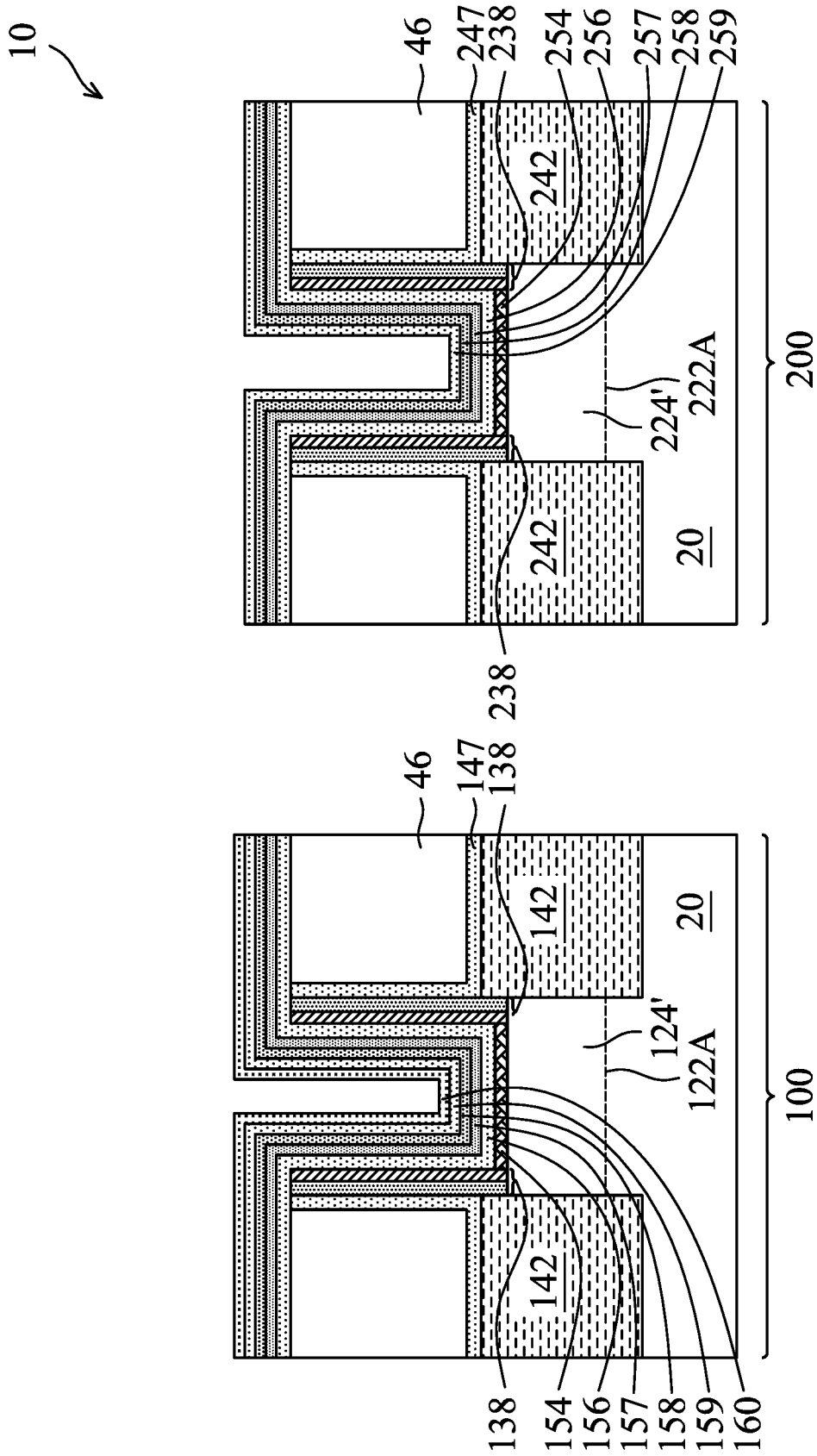

Next, referring to FIG. 10, photo resist 62 is formed and patterned, and the remaining photo resist 62 covers hard mask layer 160, while hard mask layer 260 in device region 200 is exposed. Hard mask layer 260 is then etched using photo resist 62 as the etching mask, so that the underlying layers in device region 200 are exposed. Photo resist 62 is then removed, and the resulting structure is shown in FIG. 11.

Figure 12:
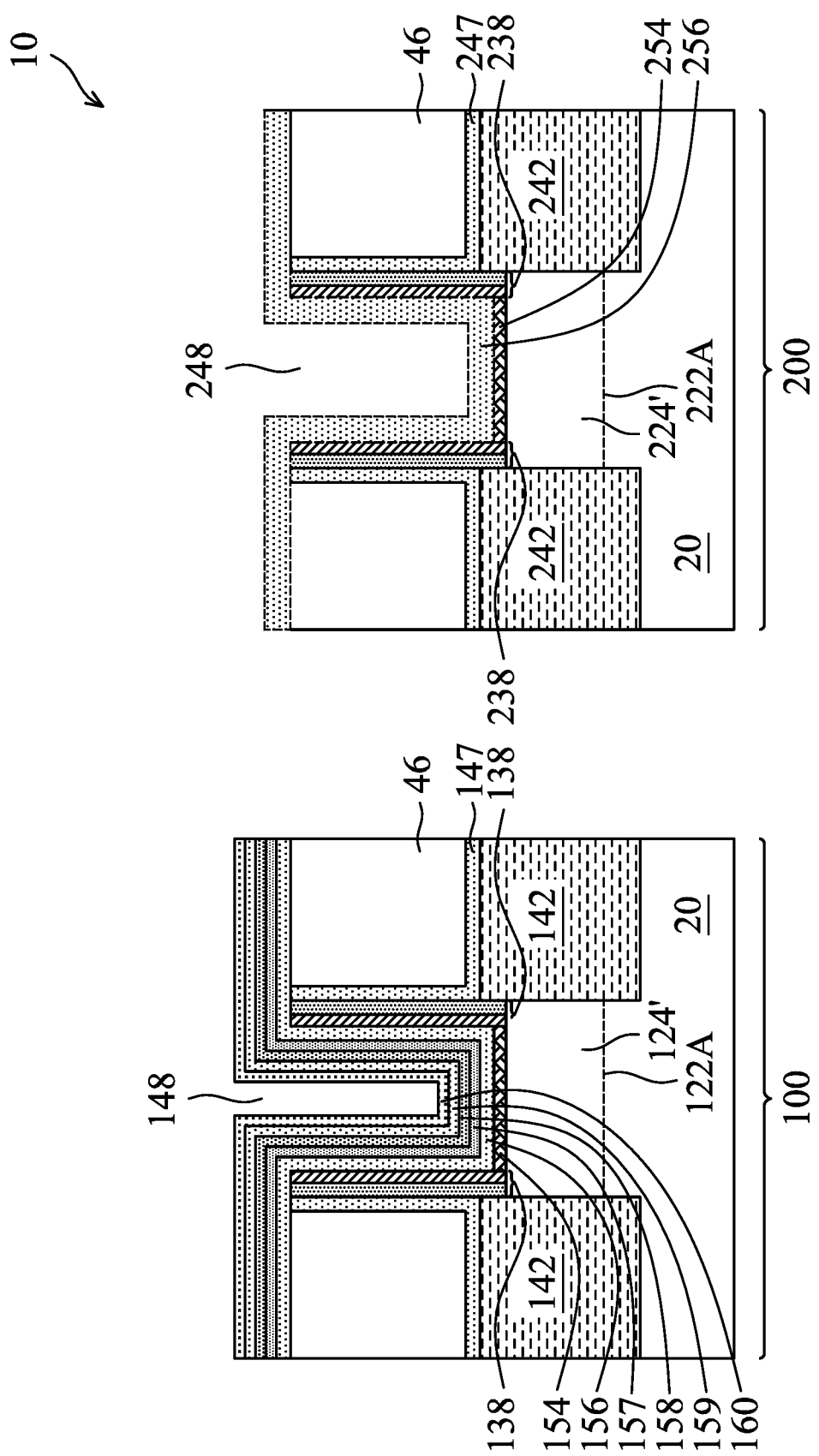
Figure 21:
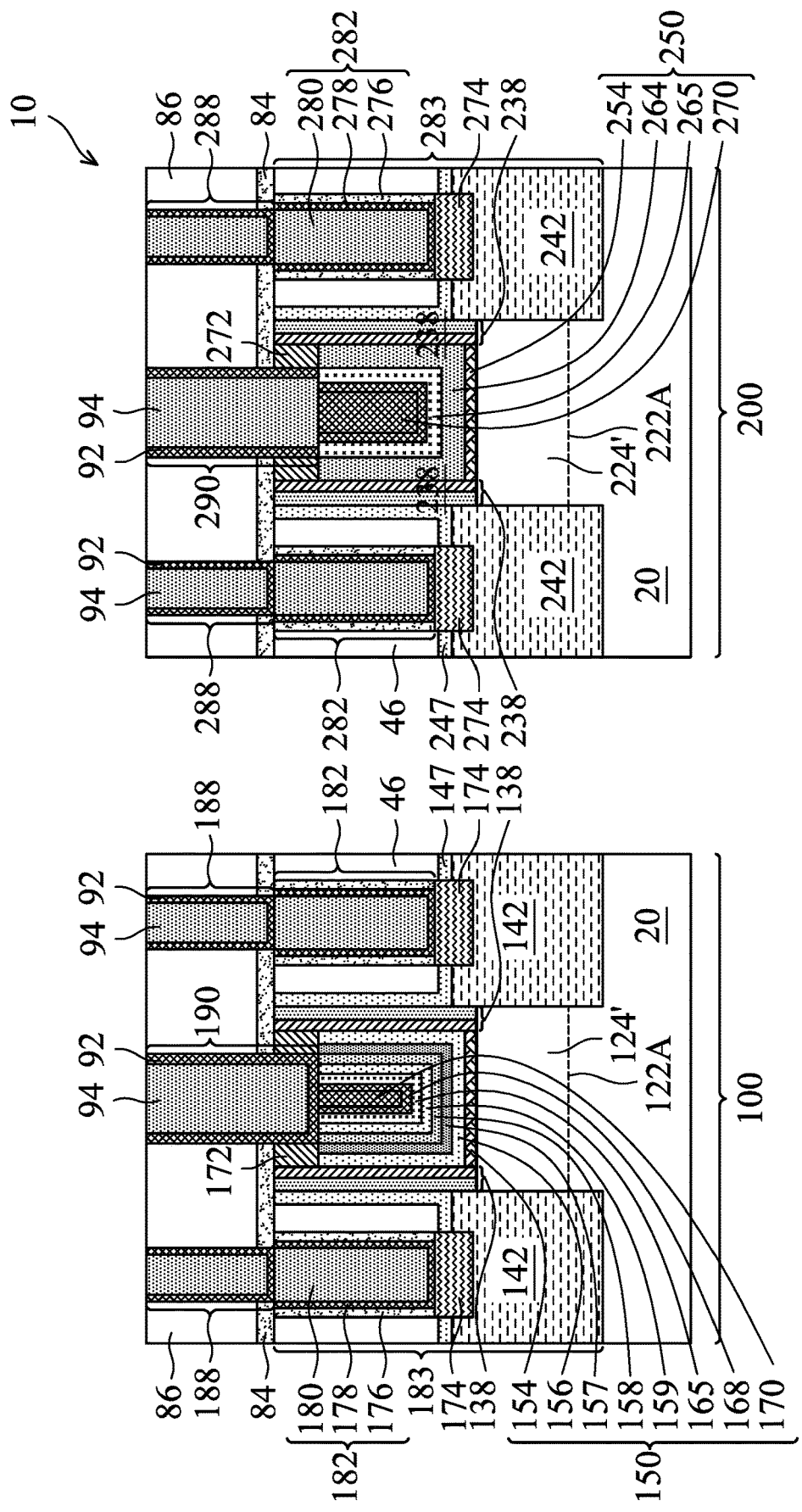

FIG. 12 illustrates the removal of lanthanum-containing layers (including LaSiO layer 259 and lanthanum oxide layer 258) from device region 200 using hard mask 160 as an etching mask. The respective step is illustrated as step 316 in the process shown in FIG. 23. Hafnium oxide layer 257 is also removed to prevent the "contamination" of lanthanum to the resulting transistor in device region 200. In accordance with some embodiments of the present disclosure, hafnium silicate layer 256 is removed from device region 200. In accordance with alternative embodiments, hafnium silicate layer 256 is not removed, and will be left between layers 254 and 265 in the resulting transistor 283 as shown in FIG. 21. Accordingly, in FIG. 12, hafnium silicate layer 256 is illustrate as having dashed boundaries to indicate the deposited hafnium silicate layer 256 may or may not exist. In subsequent Figures, hafnium silicate layer 256 is not illustrated, although hafnium silicate layer 256 may exist in accordance with some embodiments.

Figure 13:
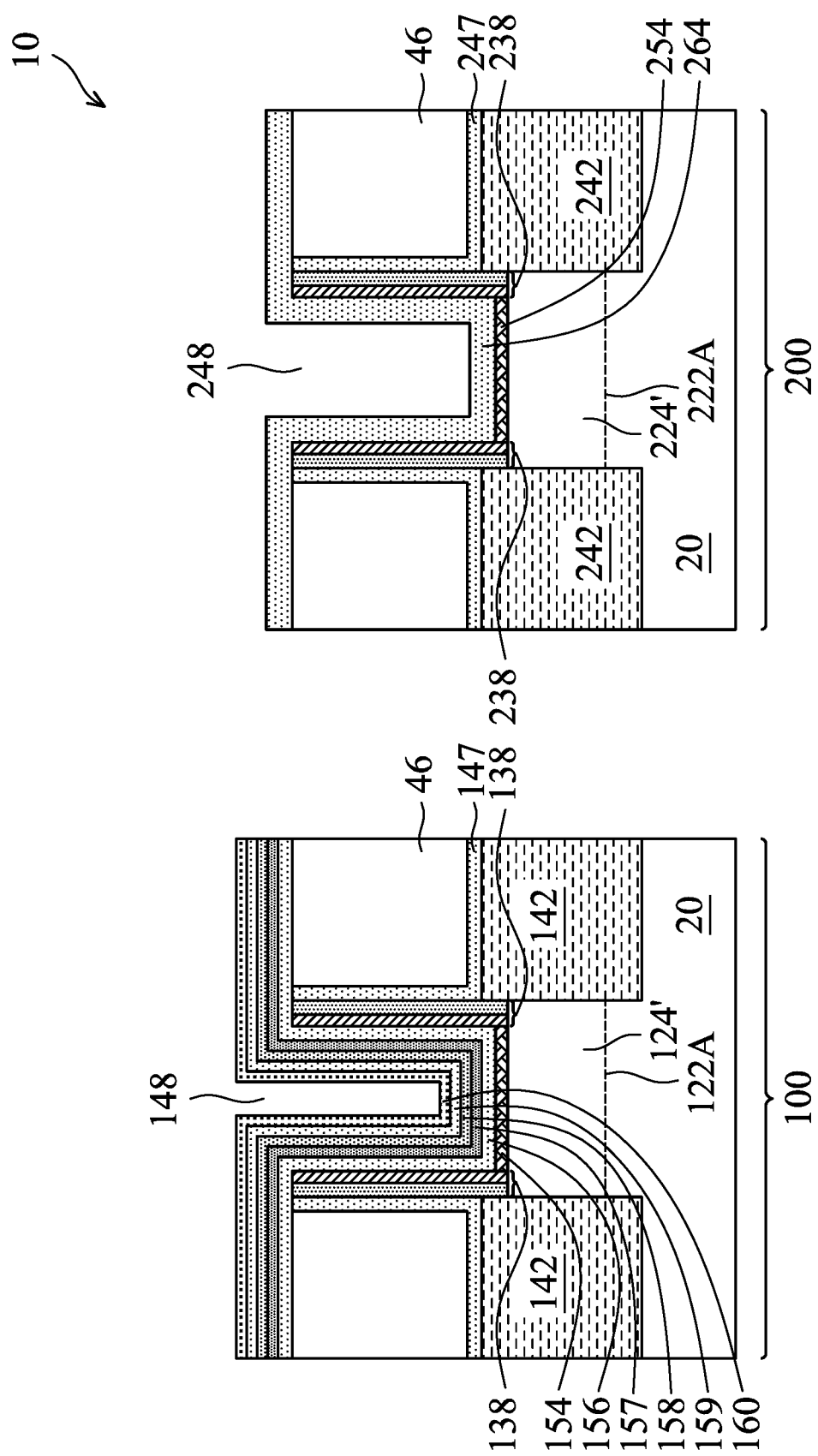

FIG. 13 illustrates the formation of high-k dielectric layer 264. The respective step is illustrated as step 318 in the process shown in FIG. 23. In accordance with some embodiments of the present disclosure in which a p-type transistor is to be formed in device region 200, high-k dielectric layer 264 is formed of a high-k dielectric material having a high k value and a high valence band offset. The respective high-k dielectric material may include hafnium oxide, aluminum oxide, zirconium oxide, or the like. When hafnium oxide is formed, hafnium oxide layer 264 may have a hafnium atomic percentage higher than, lower than, or equal to the hafnium atomic percentage in hafnium oxide layer 157. Furthermore, the thickness of hafnium oxide layer 264 may be greater than, smaller than, or equal to the respective thickness of hafnium oxide layer 157. In accordance with other embodiments in which an n-type transistor is to be formed in device region 200, high-k dielectric layer 264 is formed of a high-k dielectric material having a high k value and a high conduction band offset such as aluminum oxide. The material of high-k dielectric layer 264 may also be deposited into device region 100 at the same time high-k dielectric layer 264 is formed.

Figure 14:
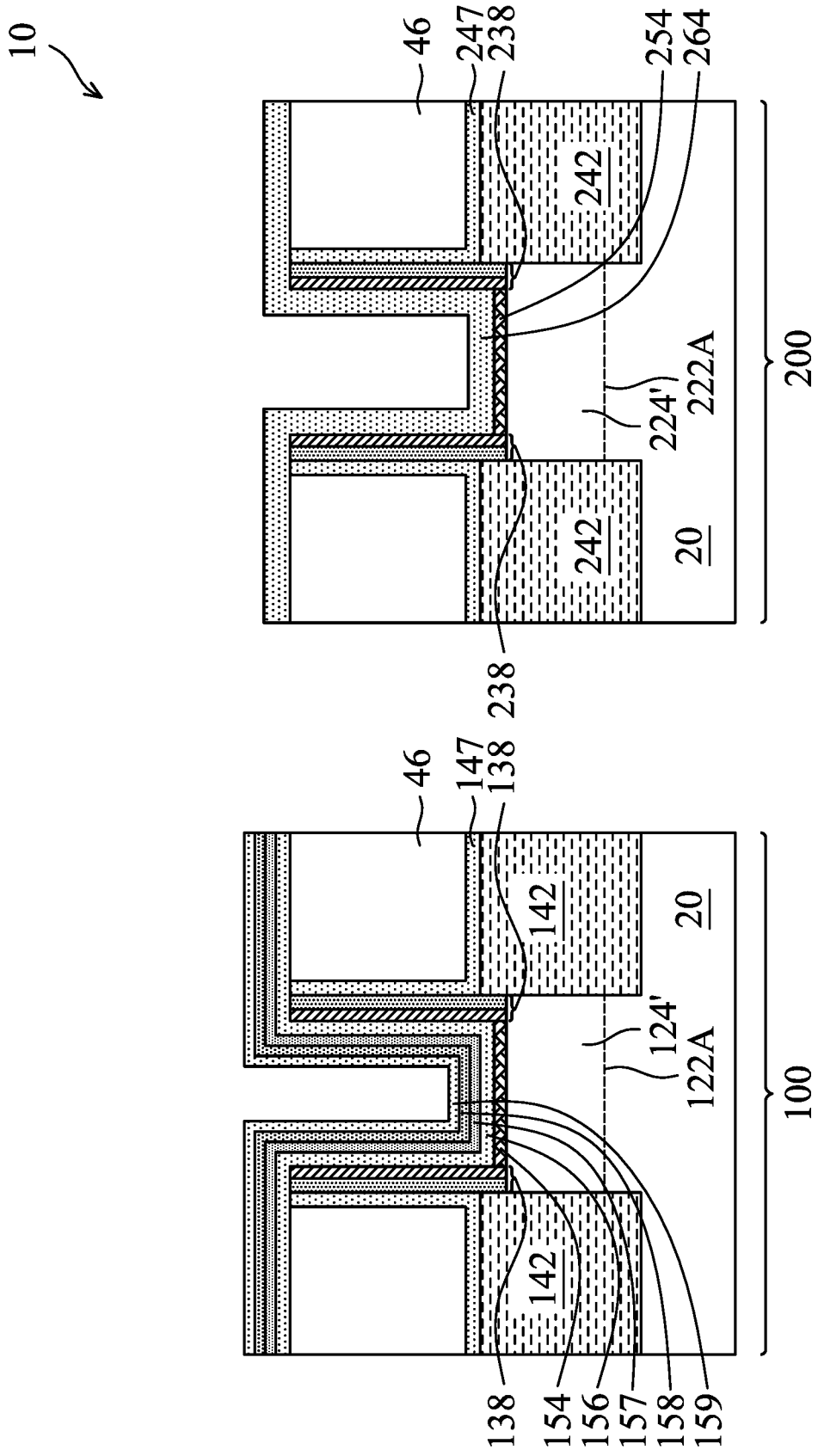

Hard mask 160 is then removed. Furthermore, if the high-k dielectric material is also deposited into device region 100 when high-k dielectric layer 264 is formed, the high-k dielectric material is also removed from device region 100. As a result, in device region 100, LaSiO layer 159 or lanthanum oxide layer 158 (if LaSiO layer 159 is not formed) is exposed, and in device region 200, high-k dielectric layer 264 is exposed. The resulting structure is shown in FIG. 14.

Figure 15:
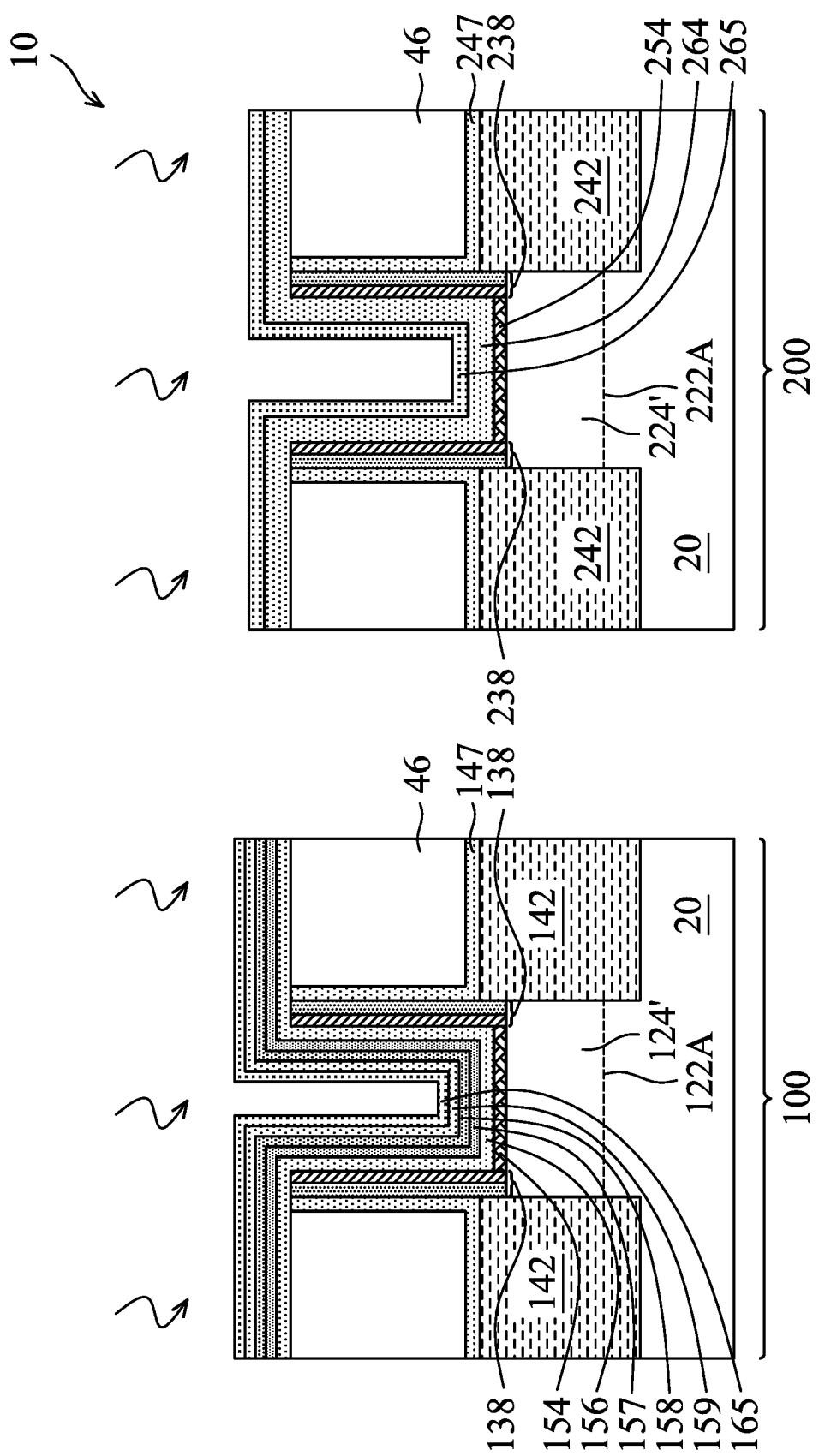

FIG. 15 illustrates the deposition of conductive adhesion layer 165 and 265, which may include Titanium Silicon Nitride (TSN) in accordance with some embodiments. A low-temperature anneal may be performed, as represented by arrows. The anneal may be a flash anneal or a furnace anneal, which may be performed at a temperature between about 550° C. and about 700° C.

Figure 16:
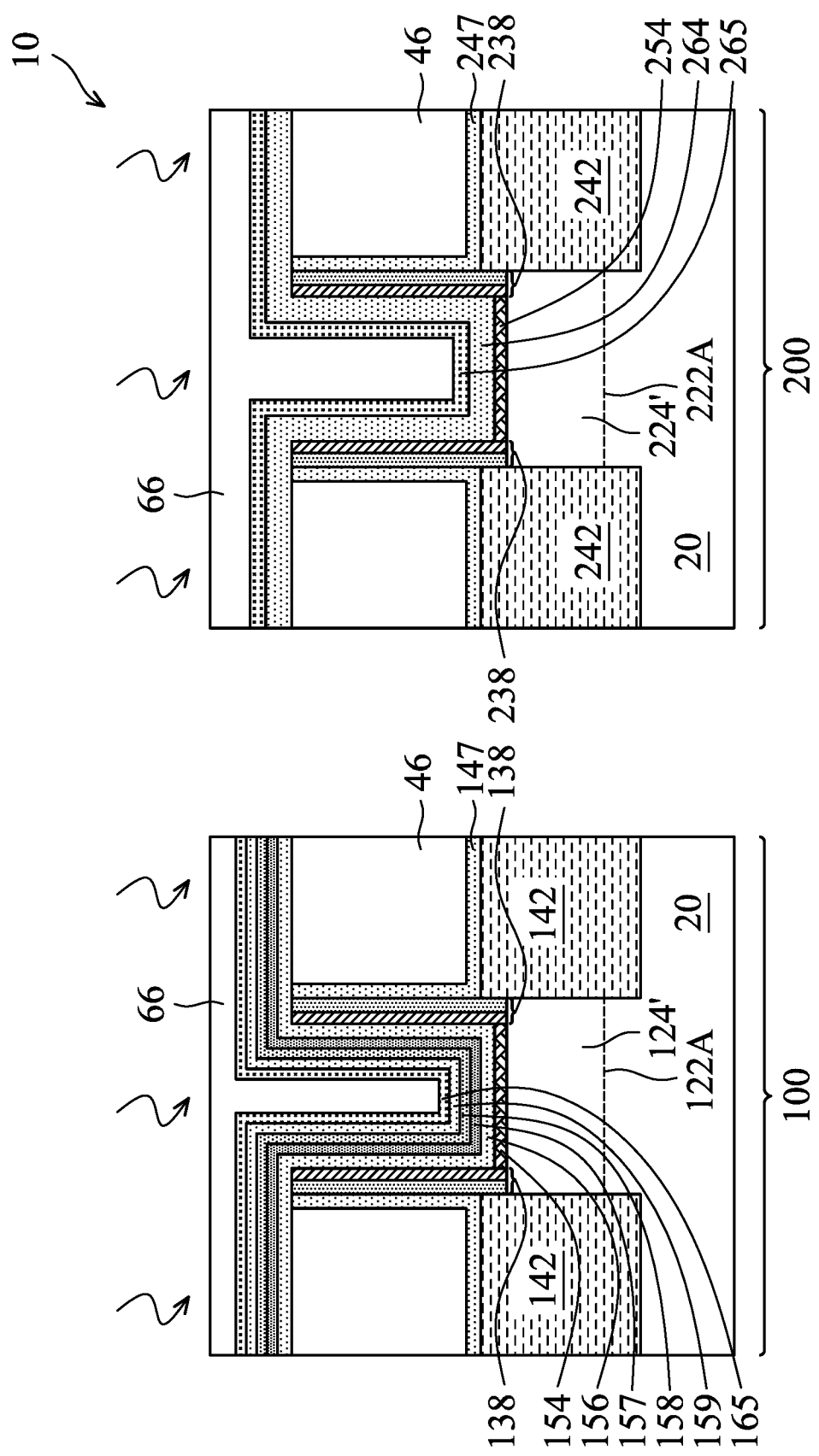

Next, as shown in FIG. 16, cap layer 66 is formed in device regions 100 and 200. In accordance with some embodiments, cap layer 66 is formed of silicon. With silicon cap layer 66 covering the layers in device regions 100, a high-temperature anneal is performed to stabilize the structure and the layers underlying cap layer 66. The anneal may be a flash anneal performed at a temperature between about 1,000° C. and 1,150° C. After the anneal, cap layer 66 is removed.

Figure 17:
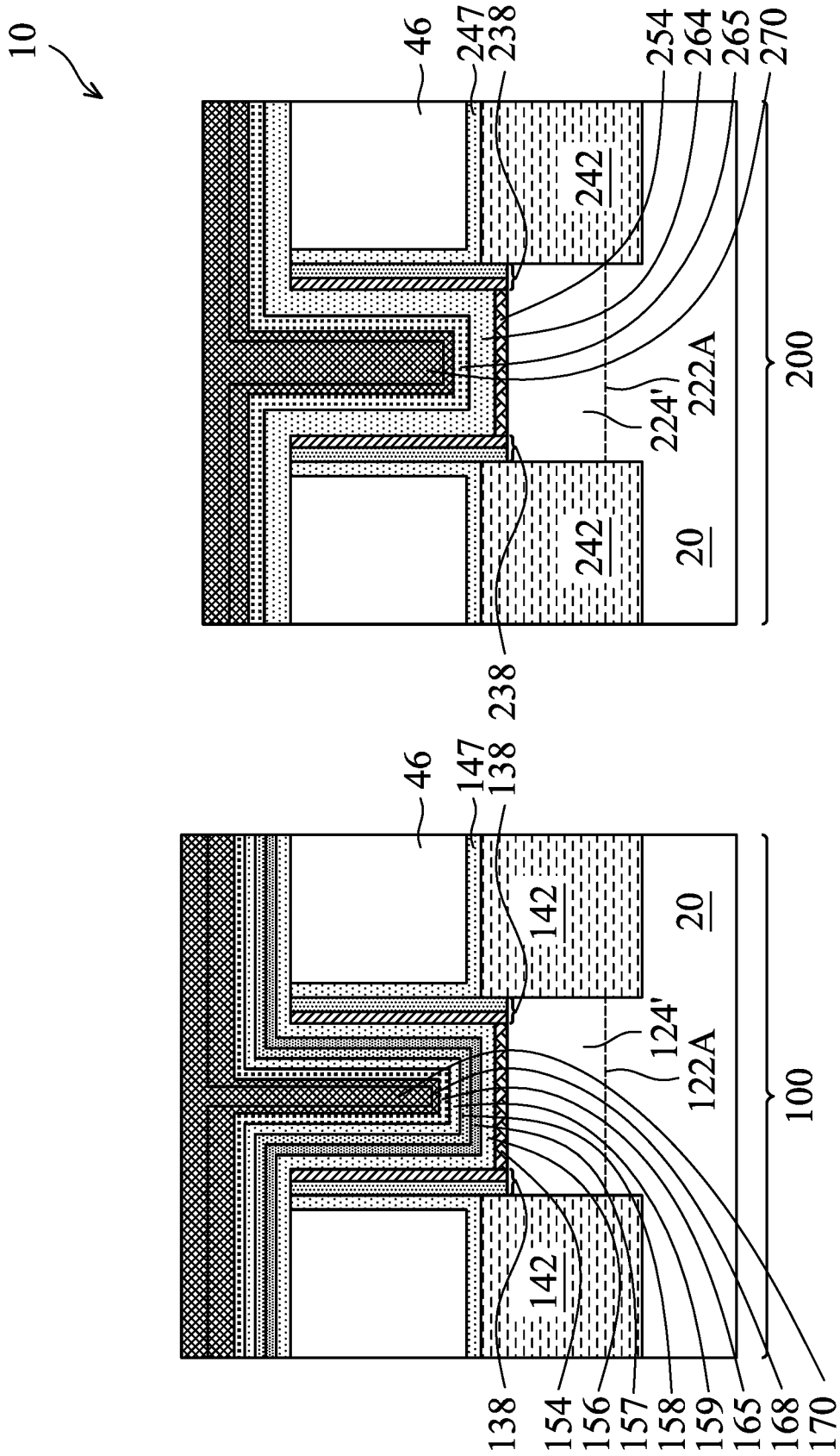

Further referring to FIG. 17, metal-containing conductive layers 168 and 268 are formed through deposition. The respective step is illustrated as step 320 in the process shown in FIG. 23. The deposition may be performed using a conformal deposition method such as ALD or CVD, so that the horizontal portions and the vertical portions of metal-containing layer 168/268 (and each of sub-layers) have thicknesses substantially equal to each other. Each of metal-containing layers 168 and 268 includes at least one layer, or may include a plurality of layers (not shown) formed of different materials. Metal-containing conductive layers 168 and 268 may be formed separately. The materials of the layers in metal-containing layers 168 and 268 may include work-function metals selected according to whether the respective FinFETs are n-type FinFETs or p-type FinFETs. For example, since the FinFET in device region 100 is an n-type FinFET, metal-containing layers 168, which may include a plurality of layers formed of different materials therein, may include a titanium nitride (TiN) layer, a tantalum nitride (TaN) layer, and an Al-based layer (formed of, for example, TiAl, TiAlN, TiAlC, TaAlN, or TaAlC). When the FinFET in device region 200 is a p-type FinFET, metal-containing layers 268, which may include a plurality of layers formed of different materials therein, may include a TiN layer, a TaN layer, and another TiN layer, respectively. A filling metal is then filled over layers 168 and 268 to form metal regions 170 and 270. In accordance with some exemplary embodiments, the filling metal includes W, Cu, Co, Al, Ru, etc. or alloys thereof.

Figure 18:
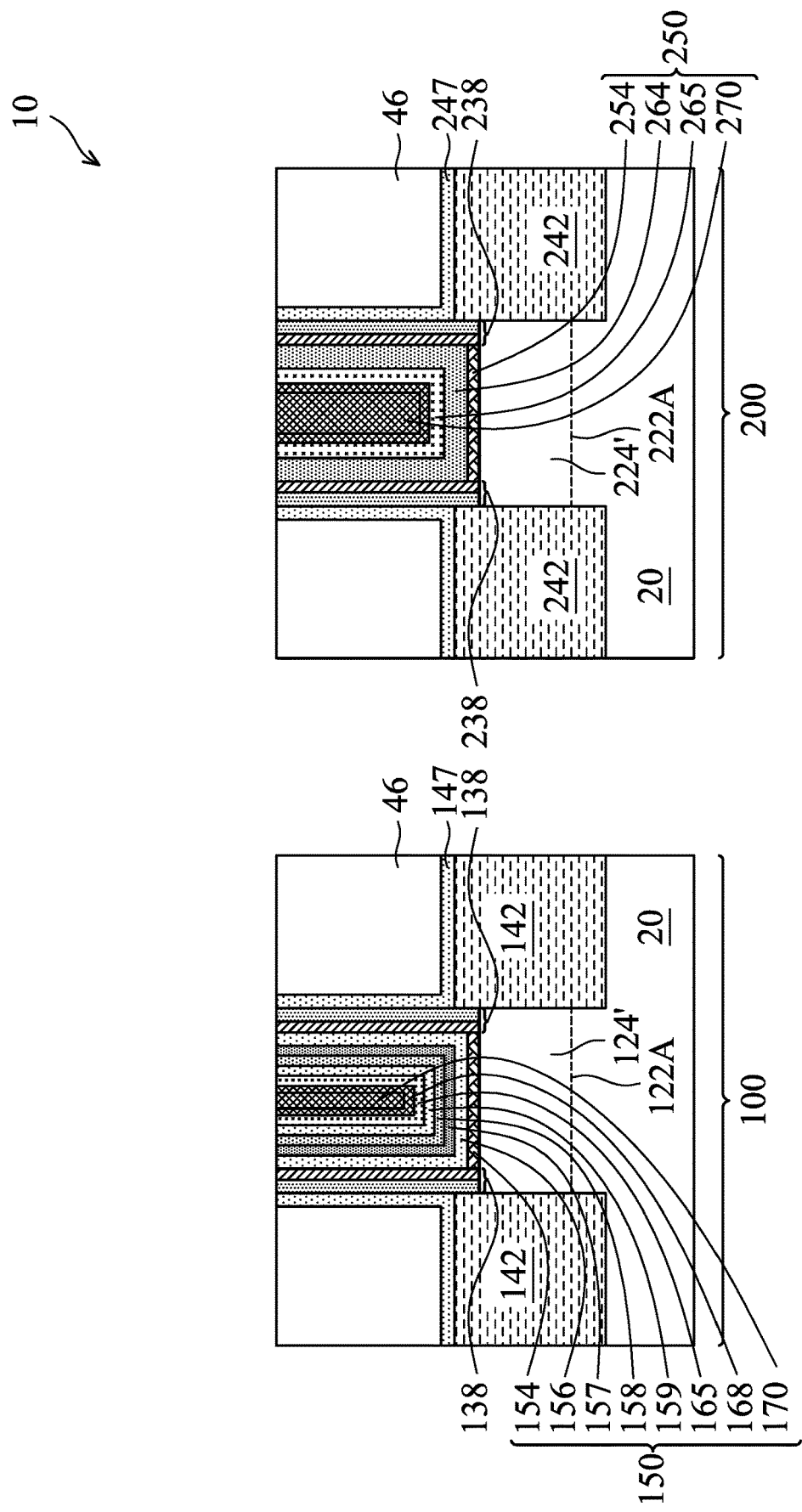

Next, a planarization step such as CMP or mechanical grinding is performed to remove excess portions of the deposited layers over the top surface of ILD 46, and hence replacement gate stacks 150 and 250 are formed. The resulting structure is shown in FIG. 18. Gate stack 150 includes IL 154, and possibly hafnium silicate layer 156, with both layers 154 and 156 being ILs. The high-k dielectric layers in replacement gate stack 150 include hafnium oxide layer 157 and lanthanum oxide layer 158, and may or may not include LaSiO layer 159. Gate stack 250 includes IL 254, and may or may not include hafnium silicate layer 256 (FIG. 12), with both layers 254 and 256 (if any) being ILs. The high-k dielectric layer in replacement gate stack 250 includes layer 264, and does not include any lanthanum-containing layer.

In gate stack 150, IL 154 has the conduction band offset of 2.3 eV, and hafnium oxide layer 157 has the conduction band offset of 1.4 eV. The significant difference between 1.4 eV and 2.3 eV results in the degradation of device performance. HfSiO layer, which is between IL 154 and hafnium oxide layer 157, has an intermediate conduction band offset of 1.8 eV, and hence hafnium silicate layer mitigates the difference between 1.4 eV and 2.3 eV, resulting in an improvement in device performance. The silicon in LaSiO has the function of holding lanthanum atoms in place in order to reduce the diffusion of lanthanum from diffusing into TSN layer 165.

Figure 19:
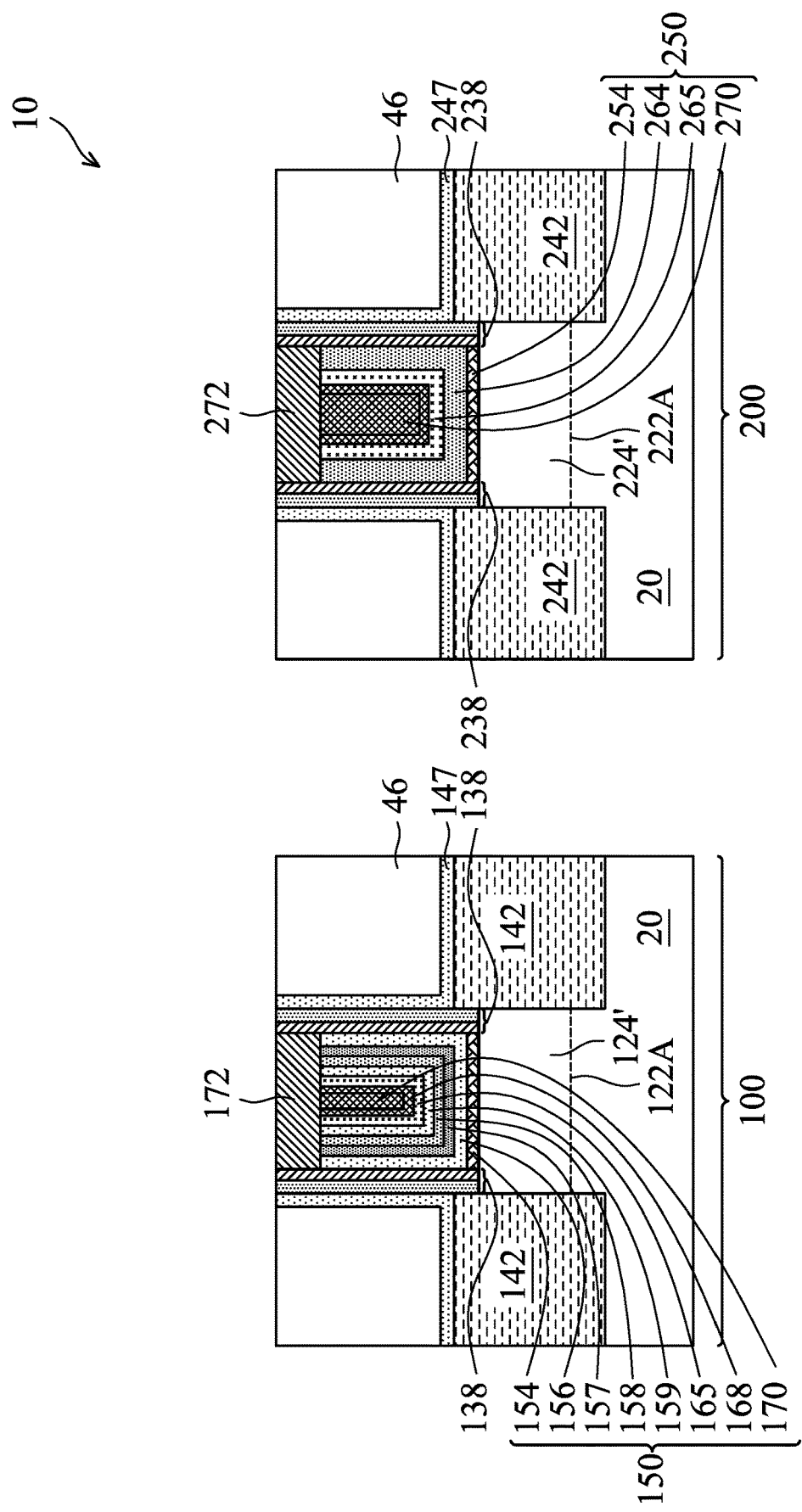

Next, gate stacks 150 and 250 are recessed to form recesses, followed by filling a dielectric material to form hard masks 172 and 272 in the recesses, as shown in FIG. 19. Another planarization step is then performed to level the top surfaces of hard masks 172 and 272 with the top surface of ILD 46. Hard masks 172 and 272 may be dielectric hard masks formed of silicon nitride, silicon oxynitride, silicon oxy-carbide, or the like.

Figure 20:
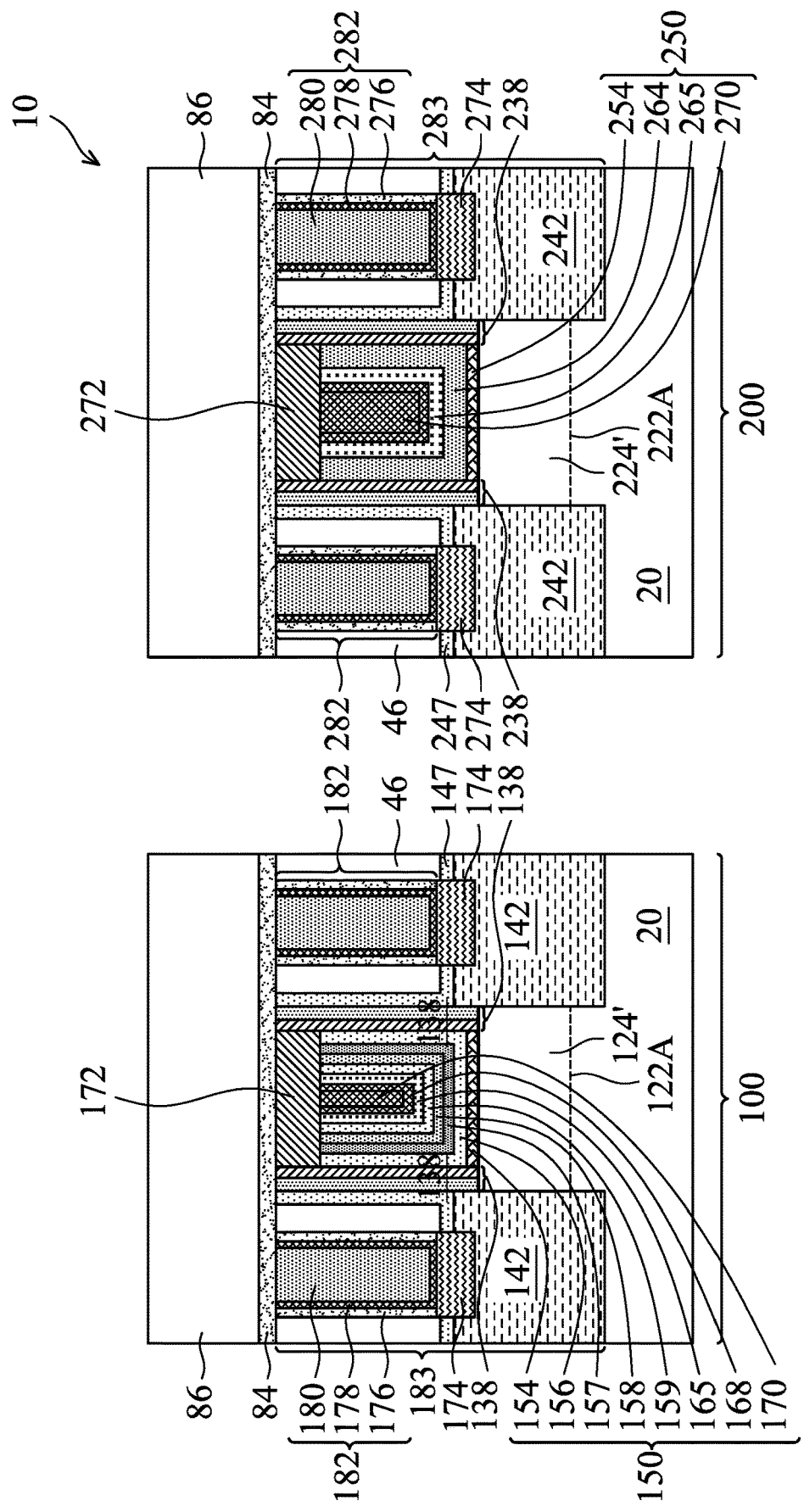

FIG. 20 illustrates the formation of source/drain silicide regions 174 and 274 and source/drain contact plugs 182 and 282. In accordance with some embodiments, metal layers 176 and 276 (titanium layers, for example) are deposited as a blanket layer, followed by a nitridation process performed on the top portion of metal layers 176 and 276 to form metal nitride layers 178 and 278. The bottom portion of metal layers 176 and 276 are not nitridated. Next, an anneal (which may be rapid thermal anneal) is performed to react the metal layers 176 and 276 with the top portions of source/drain regions 142 and 242 to form silicide regions 174 and 274. The portions of metal layers 176 and 276 on the sidewalls of ILD 46 are not reacted. Metal regions 180 and 280 are then formed, for example, by filling tungsten, cobalt, or the like, followed by a planarization to remove excess materials, resulting in lower source/drain contact plugs 182 and 282. Contact plug 182 includes layers 176, 178, and 180, and contact plug 282 including layers 276, 278, and 280. FinFETs 183 and 283 are thus formed.

Further referring to FIG. 20, etch stop layer 84 is formed. In accordance with some embodiments, etch stop layer 84 is formed of SiN, SiCN, SiC, SiOCN, or another dielectric material. The formation method may include PECVD, ALD, CVD, or the like. Next, ILD 86 is formed over etch stop layer 84. The material of ILD 86 may be selected from the same candidate materials (and methods) for forming ILD 46, and ILDs 46 and 86 may be formed of the same or different dielectric materials. In accordance with some embodiments, ILD 86 is formed using PECVD, FCVD, spin-on coating, or the like, and may include silicon oxide ($SiO_2$).

ILD 86 and etch stop layer 84 are etched to form openings (not shown). The etching may be performed using, for example, Reactive Ion Etch (RIE). In a subsequent step, as shown in FIG. 21, plugs/vias 188, 190, 288, and 290 are formed. In accordance with some embodiments of the present disclosure, plugs/vias 188, 190, 288, and 290 include barrier layers 92 and metal-containing material 94 over the barrier layers. In accordance with some embodiments of the present disclosure, the formation of plugs/vias 188, 190, 288, and 290 includes forming a blanket barrier layer 92 and a metal-containing material 94 over the blanket barrier layer, and performing a planarization to remove excess portions of the blanket barrier layer and the metal-containing material. Barrier layer 92 may be formed of a metal nitride such as titanium nitride or tantalum nitride. Metal-containing material 94 may be formed of tungsten, cobalt, copper, or the like.

The embodiments of the present disclosure have some advantageous features. Hafnium oxide, although being a good high-k dielectric material for P-type transistors due to its high k value and high valence band offset, is not good enough for n-type transistors, particular for forming n-type transistors with low threshold voltages. Lanthanum oxide, on the other hand, is a good high-k dielectric material for N-type transistors due to its high k value (about 30), high bandgap (about 6.0 eV), and high conduction band offset (about 2.3 eV). Also, at the same effective oxide thickness (EOT), lanthanum oxide has much lower leakage current than hafnium oxide, aluminum oxide, and silicon oxide. However, lanthanum oxide may interact with silicon oxide due to the diffusion of lanthanum into IL to induce high interface trap density, and hence the leakage of the resulting transistor is high. In accordance with some embodiments of the present disclosure, a hafnium oxide layer is used to separate lanthanum oxide from silicon oxide (IL), so that lanthanum is prevented from diffusing into silicon oxide.

Figure 22:
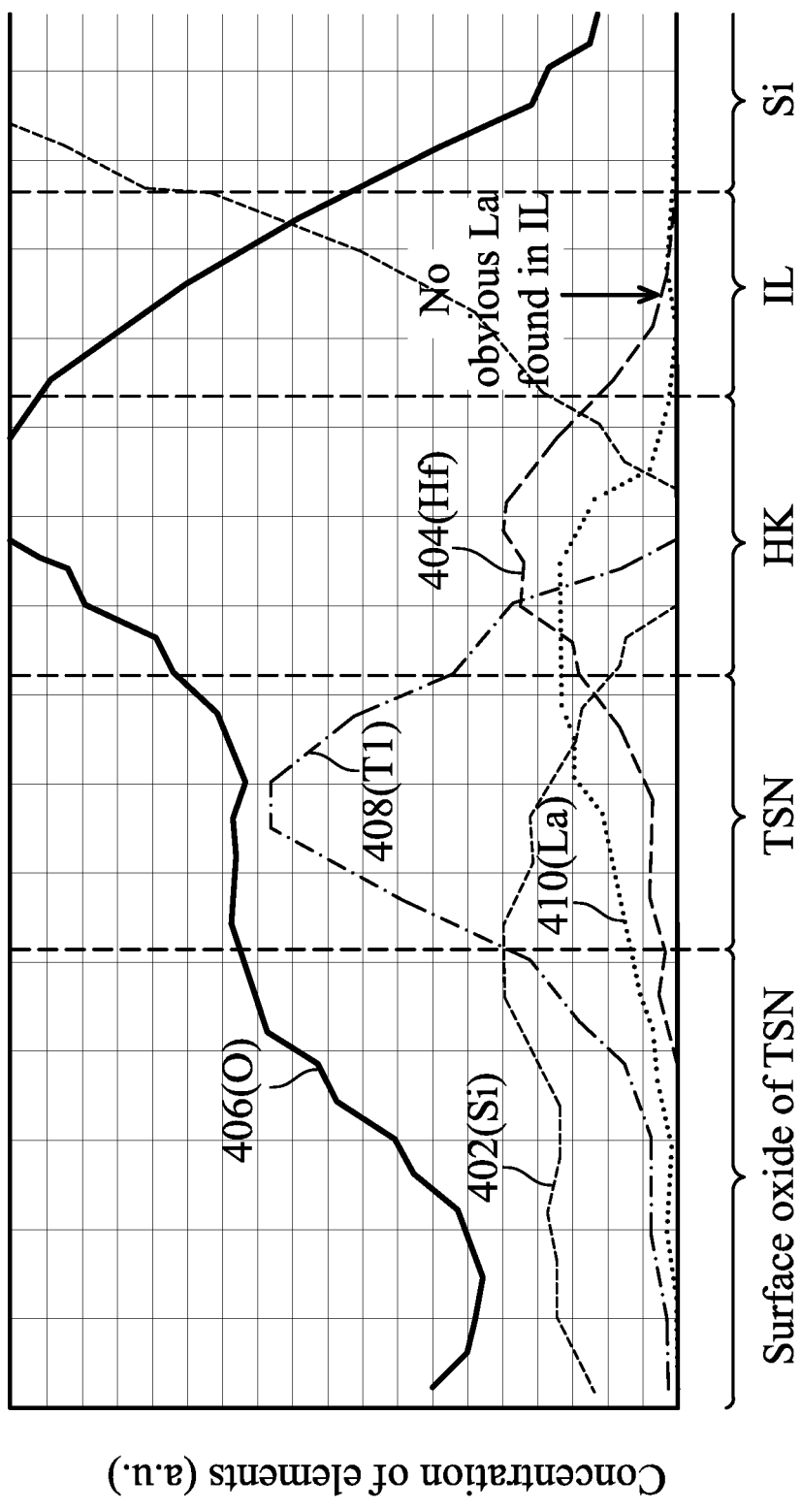
FIG. 22 illustrates the diffusion profiles of some elements in the stacked layers of a replacement gate stack in accordance with some embodiments.

FIG. 22 illustrates the diffusion profiles of lanthanum in High-K (noted as "HK" in FIG. 22, hafnium oxide) layer, IL, silicon, and TSN, which are obtained from sample wafers. The HK layer includes a hafnium layer and a lanthanum oxide layer over the hafnium oxide layer. Lines 402, 404, 406, 408, and 410 show the concentrations of silicon, hafnium, oxygen, titanium, and lanthanum, respectively. Line 410 shows that IL is free or substantially free (with atomic percentage lower than about 2 percent) from lanthanum, indicating that hafnium oxide (HK) is a good blocking layer for preventing lanthanum from diffusing into IL. Accordingly, with the addition of the hafnium oxide layer, the undesirable interaction of lanthanum with silicon oxide is prevented, and the leakage current of the respective transistor is reduced. In addition, by using the lanthanum oxide as the high-k dielectric material, more dipoles are formed, and leakage current is further reduced.

In accordance with some embodiments of the present disclosure, a method includes forming a gate stack of a transistor. The formation of the gate stack includes forming a silicon oxide layer on a semiconductor region, depositing a hafnium oxide layer over the silicon oxide layer, depositing a lanthanum oxide layer over the hafnium oxide layer, and depositing a work-function layer over the lanthanum oxide layer. Source/drain regions are formed on opposite sides of the gate stack.

In accordance with some embodiments of the present disclosure, a method includes forming a silicon oxide layer having a first portion and a second portion over a first semiconductor region and a second semiconductor region, respectively, depositing a first hafnium oxide layer having a first portion and a second portion over the first portion and the second portion, respectively, of the silicon oxide layer, depositing a lanthanum oxide layer having a first portion and a second portion over the first portion and the second portion, respectively, of the first hafnium oxide layer, removing the second portion of the lanthanum oxide layer and the second portion of the first hafnium oxide layer, depositing a second hafnium oxide layer over the second portion of the silicon oxide layer, and depositing a first work function layer over the first portion of the lanthanum oxide layer and a second work function layer over the second hafnium oxide layer, respectively.

In accordance with some embodiments of the present disclosure, a transistor includes a gate stack, which further includes a silicon oxide layer on a semiconductor region, a hafnium oxide layer over the silicon oxide layer, a lanthanum oxide layer over the hafnium oxide layer, and a work-function layer over the lanthanum oxide layer. A source/drain region is on a side of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a first gate stack of a first transistor comprising:
  forming a silicon oxide layer on a semiconductor region;

depositing a hafnium oxide layer over the silicon oxide layer;

depositing a lanthanum oxide layer over the hafnium oxide layer;

depositing a lanthanum silicon oxide layer over the lanthanum oxide layer;

depositing a work-function layer over the lanthanum silicon oxide layer; and forming first source/drain regions on opposite sides of the first gate stack.

2. The method of claim 1 further comprising depositing a hafnium silicate layer between the silicon oxide layer and the hafnium oxide layer.

3. The method of claim 2, wherein the hafnium silicate layer has a hafnium atomic percentage lower than about 10 percent.

4. The method of claim 1, wherein at a time before the hafnium oxide layer is deposited and after the silicon oxide layer is formed, the silicon oxide layer is free from hafnium.

5. The method of claim 1 further comprising:

removing the lanthanum oxide layer and the hafnium oxide layer; and depositing another hafnium oxide layer over the silicon oxide layer.

6. The method of claim 1 further comprising depositing a titanium silicon nitride layer over the lanthanum oxide layer.

7. A method comprising:

forming a silicon oxide layer comprising a first portion and a second portion over a first semiconductor region and a second semiconductor region, respectively;

depositing a first hafnium oxide layer comprising a first portion and a second portion over the first portion and the second portion, respectively, of the silicon oxide layer;

depositing a lanthanum oxide layer comprising a first portion and a second portion over the first portion and the second portion, respectively, of the first hafnium oxide layer;

removing the second portion of the lanthanum oxide layer and the second portion of the first hafnium oxide layer;

depositing a second hafnium oxide layer over the second portion of the silicon oxide layer; and depositing a first work function layer over the first portion of the lanthanum oxide layer and a second work function layer over the second hafnium oxide layer, respectively.

8. The method of claim 7 further comprising:

forming n-type source/drain regions on opposite sides of the first work function layer; and forming p-type source/drain regions on opposite sides of the second work function layer.

9. The method of claim 7 further comprising depositing a titanium silicon nitride layer comprising:

a first portion over the first portion of the lanthanum oxide layer; and a second portion over and in contact with the second hafnium oxide layer.

10. The method of claim 7 further comprising:

depositing a lanthanum silicon oxide layer comprising a first portion and a second portion over the first portion and the second portion, respectively, of the lanthanum oxide layer; and removing the second portion of the lanthanum silicon oxide layer.

11. The method of claim 7 further comprising:

depositing a hafnium silicate layer comprising a first portion and a second portion over the first portion and the second portion of the silicon oxide layer, respectively; and removing the second portion of the hafnium silicate layer.

12. The method of claim 11, wherein the hafnium silicate layer has a hafnium atomic percentage lower than about 10 percent.

13. The method of claim 7 further comprising performing an anneal on the lanthanum oxide layer and the first hafnium oxide layer.

14. A method comprising:

forming a gate stack of a transistor, the forming the gate stack comprising:

forming a silicon oxide layer on a semiconductor region;

depositing a hafnium oxide layer over the silicon oxide layer;

depositing a lanthanum oxide layer over the hafnium oxide layer;

removing the lanthanum oxide layer; and forming a source/drain region on a side of the gate stack.

15. The method of claim 14 further comprising depositing a hafnium silicate layer over the silicon oxide layer, wherein the hafnium oxide layer is deposited over the hafnium silicate layer.

16. The method of claim 14 further comprising removing the hafnium oxide layer.

17. The method of claim 14 further comprising annealing the lanthanum oxide layer.

18. The method of claim 17 further comprising depositing a work-function layer, wherein the annealing is performed before the work-function layer is deposited.

19. The method of claim 16 further comprising, after the lanthanum oxide layer and the hafnium oxide layer are removed, forming a high-k dielectric layer over and contacting the silicon oxide layer.

20. The method of claim 2, wherein the hafnium silicate layer contacts both of the silicon oxide layer and the hafnium oxide layer.

* * * * *